US011312629B2

(12) United States Patent
Zhamu et al.

(10) Patent No.: US 11,312,629 B2
(45) Date of Patent: *Apr. 26, 2022

(54) PROCESS FOR PRODUCING MONOLITHIC FILM OF INTEGRATED HIGHLY ORIENTED HALOGENATED GRAPHENE SHEETS OR MOLECULES

(71) Applicant: Global Graphene Group, Inc., Dayton, OH (US)

(72) Inventors: Aruna Zhamu, Springboro, OH (US); Bor Z. Jang, Centerville, OH (US)

(73) Assignee: Global Graphene Group, Inc., Dayton, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/688,525

(22) Filed: Nov. 19, 2019

(65) Prior Publication Data

US 2020/0102221 A1 Apr. 2, 2020

Related U.S. Application Data

(63) Continuation of application No. 15/705,890, filed on Sep. 15, 2017, now Pat. No. 10,479,690, which is a continuation of application No. 14/756,591, filed on Sep. 23, 2015, now Pat. No. 9,809,459.

(51) Int. Cl.
*C01B 32/194* (2017.01)
*C23C 16/06* (2006.01)

(52) U.S. Cl.
CPC ............ *C01B 32/194* (2017.08); *C23C 16/06* (2013.01)

(58) Field of Classification Search
CPC .............................. C01B 32/194; C23C 16/06
See application file for complete search history.

(56) References Cited

U.S. PATENT DOCUMENTS

| 7,071,258 B1 | 7/2006 | Jang et al. |
| 8,865,932 B2 | 10/2014 | Zhou et al. |
| 10,479,690 B2 * | 11/2019 | Zhamu ................. C01B 32/194 |
| 2005/0271574 A1 | 12/2005 | Jang et al. |
| 2008/0048152 A1 | 2/2008 | Jang et al. |

(Continued)

OTHER PUBLICATIONS

Hwang et al., "Enhanced Mechanical Properties of Graphene/Copper Nanocomposites Using a Molecular-Level Mixing Process" Advanced Materials (2013) vol. 25, pp. 6724-6729.

(Continued)

*Primary Examiner* — Michael P Wieczorek

(57) ABSTRACT

A process for producing an integrated layer (10 nm to 500 µm) of highly oriented halogenated graphene sheets, comprising: (a) preparing a graphene oxide (GO) dispersion having GO sheets dispersed in a fluid medium; (b) dispensing and depositing a layer of GO dispersion onto a surface of a supporting substrate under a shear stress condition that induces orientation of GO sheets to form a wet layer of GO on the supporting substrate; (c) introducing a halogenating agent into the wet layer of graphene oxide and effecting a chemical reaction between the halogenating agent and GO sheets to form a wet layer of halogenated graphene, $C_6Z_xO_y$, wherein Z is a halogen element selected from F, Cl, Br, I, or a combination thereof, x=0.01 to 6.0, y=0 to 5.0, and x+y≤6.0; and (d) removing the fluid medium.

6 Claims, 12 Drawing Sheets

(56) References Cited

U.S. PATENT DOCUMENTS

| | | |
|---|---|---|
| 2011/0269629 A1 | 11/2011 | Giustino et al. |
| 2012/0085991 A1 | 4/2012 | Cohen et al. |
| 2012/0321953 A1* | 12/2012 | Chen .................. B82Y 30/00 429/219 |
| 2014/0242275 A1* | 8/2014 | Zhamu .................. C01B 32/19 427/228 |
| 2015/0239741 A1 | 8/2015 | Burton et al. |
| 2015/0284253 A1 | 10/2015 | Zhamu et al. |

OTHER PUBLICATIONS

Jeon et al. "Facile, scalable synthesis of edge-halogenated graphene nanoplatelets as efficient metal-free electrocatalyst for oxygen reduction reaction" Scientific Reports (2013) vol. 3:1820. Doi:10.1038/srep01810.

PCT/US16/051058, International Search Report and Written Report dated Feb. 3, 2017, 10 pages.

U.S. Appl. No. 14/756,591, Nonfinal Office Action dated Mar. 13, 2017, 8 pages.

U.S. Appl. No. 14/756,592 Nonfinal Office Action dated Sep. 28, 2018, 7 pages.

U.S. Appl. No. 15/705,890 Final Office Action dated Apr. 1, 2019, 11 pages.

U.S. Appl. No. 15/705,890 Nonfinal Office Action dated Oct. 12, 2018, 10 pages.

\* cited by examiner

20 μm (75 μm wide)

Deviation angle > 45°

10 μm

PROCESS FOR PRODUCING MONOLITHIC FILM OF INTEGRATED HIGHLY ORIENTED HALOGENATED GRAPHENE SHEETS OR MOLECULES

CROSS REFERENCE TO RELATED APPLICATIONS

The present application claims priority to U.S. patent application Ser. No. 14/756,591, filed on Sep. 23, 2015 (now U.S. Pat. No. 9,809,459), which is hereby incorporated by reference, and is with U.S. patent application Ser. No. 15/705,890 (now U.S. Pat. No. 10,479,690).

FIELD OF THE INVENTION

The present invention relates generally to the field of graphene materials and, more particularly, to a new form of halogenated graphene film composed of originally separated multiple halogenated graphene sheets or molecules that are oriented and chemically merged and integrated together to form a monolithic integral layer.

BACKGROUND OF THE INVENTION

Carbon is known to have five unique crystalline structures, including diamond, fullerene (0-D nano graphitic material), carbon nano-tube or carbon nano-fiber (1-D nano graphitic material), graphene (2-D nano graphitic material), and graphite (3-D graphitic material). The carbon nano-tube (CNT) refers to a tubular structure grown with a single wall or multi-wall. Carbon nano-tubes (CNTs) and carbon nano-fibers (CNFs) have a diameter on the order of a few nanometers to a few hundred nanometers. Their longitudinal, hollow structures impart unique mechanical, electrical and chemical properties to the material. The CNT or CNF is a one-dimensional nano carbon or 1-D nano graphite material.

The constituent graphene planes of a graphite crystallite in a natural or artificial graphite particle can be exfoliated and extracted or isolated to obtain individual graphene sheets of carbon atoms provided the inter-planar van der Waals forces can be overcome. An isolated, individual graphene sheet of carbon atoms is commonly referred to as single-layer graphene. A stack of multiple graphene planes bonded through van der Waals forces in the thickness direction with an inter-graphene plane spacing of approximately 0.3354 nm is commonly referred to as a multi-layer graphene. A multi-layer graphene platelet has up to 300 layers of graphene planes (<100 nm in thickness), but more typically up to 30 graphene planes (<10 nm in thickness), even more typically up to 20 graphene planes (<7 nm in thickness), and most typically up to 10 graphene planes (commonly referred to as few-layer graphene in scientific community). Single-layer graphene and multi-layer graphene or graphene oxide sheets are collectively called "nano graphene platelets" (NGPs). Graphene or graphene oxide sheets/platelets (collectively, NGPs) are a new class of carbon nano material (a 2-D nano carbon) that is distinct from the 0-D fullerene, the 1-D CNT, and the 3-D graphite.

Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted on Oct. 21, 2002; (2) B. Z. Jang, et al. "Process for Producing Nano-scaled Graphene Plates," U.S. patent application Ser. No. 10/858,814 (Jun. 3, 2004); and (3) B. Z. Jang, A. Zhamu, and J. Guo, "Process for Producing Nano-scaled Platelets and Nanocomposites," U.S. patent application Ser. No. 11/509,424 (Aug. 25, 2006).

Isolated or separated graphene or graphene oxide sheets (NGPs) are typically obtained by intercalating natural graphite particles with a strong acid and/or oxidizing agent to obtain a graphite intercalation compound (GIC) or graphite oxide (GO), as illustrated in FIG. 5(A) (process flow chart) and FIG. 5(B) (schematic drawing). The presence of chemical species or functional groups in the interstitial spaces between graphene planes serves to increase the inter-graphene spacing ($d_{002}$, as determined by X-ray diffraction), thereby significantly reducing the van der Waals forces that otherwise hold graphene planes together along the c-axis direction. The GIC or GO is most often produced by immersing natural graphite powder (20 in FIG. 5(A) and 100 in FIG. 5(B)) in a mixture of sulfuric acid, nitric acid (an oxidizing agent), and another oxidizing agent (e.g. potassium permanganate or sodium perchlorate). The resulting GIC (22 or 102) is actually some type of graphite oxide (GO) particles. This GIC or GO is then repeatedly washed and rinsed in water to remove excess acids, resulting in a graphite oxide suspension or dispersion, which contains discrete and visually discernible graphite oxide particles dispersed in water. There are two processing routes to follow after this rinsing step:

Route 1 involves removing water from the suspension to obtain "expandable graphite," which is essentially a mass of dried GIC or dried graphite oxide particles. Upon exposure of expandable graphite to a temperature in the range of typically 800-1,050° C. for approximately 30 seconds to 2 minutes, the GIC undergoes a rapid volume expansion by a factor of 30-300 to form "graphite worms" (24 or 104), which are each a collection of exfoliated, but largely unseparated graphite flakes that remain interconnected. A SEM image of graphite worms is presented in FIG. 6(A).

In Route 1A, these graphite worms (exfoliated graphite or "networks of interconnected/non-separated graphite flakes") can be re-compressed to obtain flexible graphite sheets or foils (26 or 106) that typically have a thickness in the range of 0.1 mm (100 μm)-0.5 mm (500 μm). Alternatively, one may choose to use a low-intensity air mill or shearing machine to simply break up the graphite worms for the purpose of producing the so-called "expanded graphite flakes" (108) which contain mostly graphite flakes or platelets thicker than 100 nm (hence, not a nano material by definition).

Exfoliated graphite worms, expanded graphite flakes, and the recompressed mass of graphite worms (commonly referred to as flexible graphite sheet or flexible graphite foil) are all 3-D graphitic materials that are fundamentally different and patently distinct from either the 1-D nano carbon material (CNT or CNF) or the 2-D nano carbon material (graphene sheets or platelets, NGPs). Flexible graphite (FG) foils can be used as a heat spreader material, but exhibiting a maximum in-plane thermal conductivity of typically less than 500 W/mK (more typically <300 W/mK) and in-plane electrical conductivity no greater than 1,500 S/cm. These low conductivity values are a direct result of the many defects, wrinkled or folded graphite flakes, interruptions or gaps between graphite flakes, and non-parallel flakes (e.g. SEM image in FIG. 6(B), wherein many flakes are inclined at an angle deviating from the desired orientation direction by >30°). Many flakes are inclined with respect to one another at a very large angle (e.g. mis-orientation of 20-40 degrees). The average deviation angle is greater than 10°, more typically >20°, and often >30°.

In Route 1B, the exfoliated graphite is subjected to high-intensity mechanical shearing (e.g. using an ultrasonicator, high-shear mixer, high-intensity air jet mill, or high-energy ball mill) to form separated single-layer and multi-layer graphene sheets (collectively called NGPs, 33 or 112), as disclosed in our U.S. application Ser. No. 10/858,814. Single-layer graphene can be as thin as 0.34 nm, while multi-layer graphene can have a thickness up to 100 nm, but more typically less than 20 nm.

Route 2 entails ultrasonicating the graphite oxide suspension for the purpose of separating/isolating individual graphene oxide sheets from graphite oxide particles. This is based on the notion that the inter-graphene plane separation bas been increased from 0.3354 nm in natural graphite to 0.6-1.1 nm in highly oxidized graphite oxide, significantly weakening the van der Waals forces that hold neighboring planes together. Ultrasonic power can be sufficient to further separate graphene plane sheets to form separated, isolated, or discrete graphene oxide (GO) sheets. These graphene oxide sheets can then be chemically or thermally reduced to obtain "reduced graphene oxides" (RGO) typically having an oxygen content of 0.001%-10% by weight, more typically 0.01%-5% by weight, most typically and preferably less than 2% by weight.

For the purpose of defining the claims of the instant application, graphene or NGPs include discrete (isolated or separated) sheets/platelets of single-layer and multi-layer pristine graphene, graphene oxide, or reduced graphene oxide (RGO). Pristine graphene has essentially 0% oxygen. RGO typically has an oxygen content of 0.001%-5% by weight. Graphene oxide (including RGO) can have 0.001%-50% by weight of oxygen.

Isolated solid NGPs (i.e. discrete and separate sheets/platelets of pristine graphene, GO, and RGO having a typical length/width of 100 nm to 10 μm), when packed into a macroscopic-size film, membrane, or paper sheet (34 or 114 in FIG. 5(A) or FIG. 5(B)) by using, for instance, a paper-making process, typically do not exhibit a high thermal conductivity, as an example of useful physical properties. This is mainly ascribed to the notion that these sheets/platelets are typically poorly oriented and many types of defects are formed in the film/membrane/paper. Specifically, a paper-like structure or mat made from platelets of graphene, GO, or RGO (e.g. those paper sheets prepared by vacuum-assisted filtration process) exhibit many defects, wrinkled or folded graphene sheets, interruptions or gaps between platelets, and non-parallel platelets (e.g. SEM image in FIG. 7(B)), leading to relatively poor thermal conductivity, low electric conductivity, low dielectric breakdown strength, and low structural strength. These paper-like structures or aggregates of discrete NGP, GO or RGO platelets alone (without a resin binder) also have a tendency to get flaky, emitting conductive particles into air; but the presence of a binder resin significantly reduces the conductivity of the structure.

Graphene thin films (<5 nm and most typically <2 nm) can be prepared by catalytic chemical vapor deposition CVD of hydrocarbon gas (e.g. $C_2H_4$) on Ni or Cu surface. With Ni or Cu being the catalyst, carbon atoms obtained via decomposition of hydrocarbon gas molecules at 800-1,000° C. are deposited onto Ni or Cu foil surface to form a sheet of single-layer or few-layer graphene (2-5 layers in this case) that is poly-crystalline. These ultra-thin graphene films, being optically transparent and electrically conducting, are intended for applications such as the touch screen (to replace indium-tin oxide or ITO glass) or semiconductor devices (to replace silicon, Si). The Ni- or Cu-catalyzed CVD process does not lend itself to the deposition of more than 5-10 graphene planes (typically <5 nm and more typically <2 nm) beyond which the underlying Ni or Cu catalyst can no longer provide any catalytic effect. There has been no experimental evidence to indicate that CVD graphene film thicker than 5 nm is possible. Furthermore, the CVD process is known to be extremely expensive.

From semiconductor physics perspectives, on the one hand, multi-layer graphene sheets are a metallic or conductor material and single-layer graphene sheets are a semimetal. The single-layer pristine graphene lacks an energy band gap because its valence and conduction bands touch each other and, hence, it is labeled as a semimetal. (In contrast, Si, a semiconductor, has an energy band gap of 1.1 eV between the conduction band and valence band of its electronic configuration.) The lack of a band gap limits usage of graphene in contemporary electronic devices. The band structure of single-layer graphene can be modified to open the band gap by many strategies, e.g., halogenation, oxidation, hydrogenation or noncovalent attachment of various molecules and species.

On the other hand, heavily oxidized graphene or graphene oxide (GO) is considered an insulating material and presumably can be used as a dielectric. However, the low thermal stability of GO (against heat exposure) reduces its dielectric resistivity, which is a drawback since thermal processing steps are often used during electronic device fabrication. Furthermore, multi-layer pristine graphene (>3 layers) and reduced graphene oxide (RGO) are essentially a conductor that cannot be used as a dielectric material or an insulating material.

Dielectric materials have attracted great attention because of their potential application in gate dielectrics, dynamic random access memory, artificial muscles and energy storage devices. Dielectric (ceramic) capacitors for energy storage suffer from poor processability (e.g. processing temperature usually exceeds 1,000° C.), high density, and low breakdown strength. Traditional high dielectric perovskite ceramics, such as barium titanate-containing composites, cannot be used at situations where diverse shapes are required. Compared with inorganic ceramics, polymers are more applicable in higher electric fields. Additionally, polymers possess the following advantages over inorganic ceramics: low weight, low cost, ease in processing, and self-healing. However, low operation temperatures restrict the further development of polymer dielectrics. Commercial capacitors are only used in limited applications such as cell phones, video/audio systems, and personal computers. For example, biaxial oriented polypropylene polymer-based capacitors can only be operated at temperatures below 105° C. Thus, materials with high dielectric constants, especially those which can be used in high temperature environments, have great potential in device applications.

With these drawbacks of current dielectric materials in mind, we proceeded to investigate the potential of using graphene-derived materials for dielectric applications. After an in-depth and extensive study, we have surprisingly discovered that halogenated graphene materials thicker than 10 nm are a good dielectric material. Halogenated graphene is a group of graphene derivatives, in which some carbon atoms are covalently linked with halogen atoms. The carbon atoms linked with halogens have $sp^3$ hybridization and other carbon atoms have $sp^2$ hybridization. This implies that halogenated graphene (also referred to as graphene halide) potentially can be an insulating material. For this purpose, thicker graphene halide films (>10 nm, preferably >100 nm, further preferably >1 μm, and more preferably >10 μm) are desired. However, although ultra-thin films (e.g. <<10 nm) of graphene fluoride have been produced by the catalytic CVD preparation of pristine graphene, followed by fluorination, thicker graphene fluoride films having a combination of desired physical and chemical properties have not been available. It is known in the art that thicker dielectric materials (thicker than 5-10 nm) tend to have low dielectric breakdown strength even though most of the current devices demand to have thicker dielectric components.

Thus, it is an object of the present invention to provide a cost-effective process for producing thicker films of graphene-derived materials that exhibit a high dielectric breakdown strength, high dielectric constants, adequate mechanical strength, good thermal stability, and good chemical stability.

SUMMARY OF THE INVENTION

The present invention provides a process for producing an integrated layer of highly oriented halogenated graphene sheets or molecules, wherein the film has a thickness from 10 nm to 500 µm. The process comprises: (a) preparing either a graphene oxide dispersion having graphene oxide sheets dispersed in a fluid medium or a graphene oxide gel having graphene oxide molecules dissolved in a fluid medium, wherein the graphene oxide sheets or graphene oxide molecules contain an oxygen amount higher than 5% by weight; (b) dispensing and depositing a layer of graphene oxide dispersion or graphene oxide gel onto a surface of a supporting substrate under a shear stress condition, wherein the dispensing and depositing procedure includes shear-induced thinning of graphene oxide dispersion or gel and shear-induced orientation of graphene oxide sheets or molecules, to form a wet layer of graphene oxide on the supporting substrate; (c) either (i) introducing a halogenating agent into the wet layer of graphene oxide and effecting a chemical reaction between the halogenating agent and graphene oxide sheets or molecules to form a wet layer of halogenated graphene and removing the fluid medium from the wet layer of halogenated graphene, or (ii) removing the fluid medium from the wet layer of graphene oxide to form a dried layer of graphene oxide and introducing a halogenating agent into the dried layer of graphene oxide and effecting a chemical reaction between the halogenating agent and the graphene oxide sheets or molecules, to form a dried integrated layer of halogenated graphene having a chemical formula of $C_6Z_xO_y$, wherein Z is a halogen element selected from F, Cl, Br, I, or a combination thereof, x=0.01 to 6.0, y=0 to 5.0, and x+y≤6.0; and (d) removing the fluid medium from the wet layer of halogenated graphene to form the integrated layer of halogenated graphene having an inter-planar spacing $d_{002}$ of 0.35 nm to 1.2 nm (more typically 0.40-1.0 nm) as determined by X-ray diffraction.

It may be noted that the inter-planar spacing range of 0.350-1.2 nm, as opposed to the typically 0.3359 nm of original natural graphite is due to the presence of halogen elements or halogen-containing chemical groups (plus some residual O or O-containing groups in some cases) on graphene planes that push the neighboring planes apart.

It may be noted that, in terms of timing sequence, the halogenating agent can be introduced before, during, or after removal of the liquid medium from the wet layer of GO.

The graphene halide sheets in the dried integrated layer of graphene halide are substantially parallel to one another along one direction and the average deviation angle of these sheets is less than 10 degrees. It may be noted that, in conventional GO or RGO sheet-based paper, graphene sheets or platelets are inclined with respect to one another at a very large angle (e.g. mis-orientation of 20-40 degrees). The average deviation angle from the desired orientation angle is greater than 10°, more typically >20°, and often >30°.

We have discovered that the electric and dielectric properties of GO films rapidly degrade as the aging or heat treatment temperature exceeds 100° C. For instance, the electric resistivity could decrease from $10^{-6}$ Ω-cm to $10^{+}$Ω-cm if GO films are exposed to heat at 200° C. for a few hours; this is an 8 orders of magnitude drop in resistivity and GO becomes a totally useless dielectric material. In contrast, the presently invented integrated films of highly oriented halogenated graphene, $C_6Z_xO_y$, can be thermal stable up to 1,000-2,500° C., depending on the chemical composition. A higher x value or the x/(y+x) ratio leads to a higher maximum useful temperature. When x=1, the thermal stability temperature can be as high as 2,000-2,500° C.

In certain embodiments, timing-wise, step (b) can occur during or after step (b). Thus, the invention also provides a process which includes (a) preparing either a graphene oxide dispersion having graphene oxide sheets dispersed in a fluid medium or a graphene oxide gel having graphene oxide molecules dissolved in a fluid medium, wherein said graphene oxide sheets or graphene oxide molecules contain an oxygen amount higher than 5% by weight; (b) introducing a halogenating agent into said graphene oxide dispersion or gel and effecting a chemical reaction between said halogenating agent and said graphene oxide sheets or molecules to form a dispersion of halogenated graphene sheets or a gel of halogenated graphene molecules, wherein said halogenated graphene sheets have a chemical formula of $C_6Z_xO_y$, wherein Z is a halogen element selected from F, Cl, Br, I, or a combination thereof, x=0.01 to 6.0, y=0 to 5.0, and x+y≤6.0; (c) dispensing and depositing a layer of said halogenated graphene dispersion or gel onto a surface of a supporting substrate under a shear stress condition, wherein said dispensing and depositing procedure includes shear-induced thinning of said halogenated graphene dispersion or gel and shear-induced orientation of halogenated graphene sheets or molecules, to form a wet layer of halogenated graphene on said supporting substrate; and (d) removing said fluid medium from the wet layer of halogenated graphene to form said integrated layer of halogenated graphene having an inter-planar spacing $d_{002}$ of 0.35 nm to 1.2 nm as determined by X-ray diffraction. Further, graphene halide sheets in the dried integrated layer of graphene halide are substantially parallel to one another along one direction and the average deviation angle of these sheets is less than 10 degrees.

In various embodiments, the starting graphene oxide sheets contain single-layer graphene oxide or few-layer graphene oxide sheets each having 2-10 oxidized graphene planes. The fluid medium can be water, an alcohol, a mixture of water and alcohol, or an organic solvent.

The fluorinating agent preferably contains a chemical species in a liquid, gaseous, or plasma state containing a halogen element selected from F, Cl, Br, I, or a combination thereof. In certain embodiments, the fluorinating agent contains a chemical species in a liquid, gaseous, or plasma state containing a halogen element selected from F, Cl, Br, I, or a combination thereof. In particularly preferred embodiments, the fluorinating agent is selected from hydrofluoric acid, hexafluorophosphoric acid or $HPF_6$, $XeF_2$, $F_2$ gas, $F_2$/Ar plasma, $CF_4$ plasma, $SF_6$ plasma, HCl, $HPCl_6$, $XeCl_2$, $Cl_2$ gas, $Cl_2$/Ar plasma, $CCl_4$ plasma, $SCl_6$ plasma, HBr, $XeBr_2$, $Br_2$ gas, $Br_2$/Ar plasma, $CBr_4$ plasma, $SBr_6$ plasma, HI, $XeI_2$, $I_2$, $I_2$/Ar plasma, $Cl_4$ plasma, $SI_6$ plasma, or a combination thereof.

The step of dispensing and depositing can include a printing, spraying, coating and/or casting procedure, which is in combination with a shear stress procedure. The coating process can include a slot die coating or comma coating procedure. More preferably, the dispensing and depositing step includes a reverse roll transfer coating procedure.

In some preferred versions of reverse roll transfer coating process, the step of dispensing and depositing includes dispensing the layer of graphene oxide dispersion or graphene oxide gel onto a surface of an application roller rotating in a first direction at a first line velocity to form an applicator layer of graphene oxide, wherein the application roller transfers the applicator layer of graphene oxide to a surface of a supporting film driven in a second direction opposite to the first direction at a second line velocity, to form the wet layer of graphene oxide on the supporting film. The supporting film may be driven by a counter-rotating supporting roller disposed at a working distance from the application roller and rotating in the second direction opposite to the first direction.

The velocity ratio, defined as (said second line velocity)/(said first line velocity), is preferably from 1/5 to 5/1, more preferably is greater than 1/1 and less than 5/1. If the external surface of the application roller moves at the same speed as the linear movement speed of the supporting film, then the velocity ratio is 1/1 or unity. If, as an example, the external surface of the application roller moves at a speed three times as fast as the linear movement speed of the supporting film, then the velocity ratio is 3/1. In certain embodiments, the velocity ratio is greater than 1/1 and less than 5/1. Preferably, the velocity ratio is greater than 1/1 and up to 3/1.

In certain embodiments, the step of dispensing graphene oxide dispersion or graphene oxide gel onto the surface of the application roller includes using a metering roller and/or a doctor's blade to provide a desired thickness of the applicator layer of graphene oxide on the application roller surface. The process can include operating 2, 3, or 4 rollers.

In a preferred embodiment, the supporting film is driven by a counter-rotating supporting roller disposed at a working distance from the application roller and rotating in the second direction opposite to the first direction. The speed at the external surface of this supporting roller dictates the second line velocity (of the supporting film). Preferably, the supporting film is fed from a feeder roller and the dried layer of graphene halide supported by the supporting film is wound on a winding roller and the process is conducted in a roll-to-roll manner.

Preferably, the invented process further comprises a step of aging the wet layer of graphene oxide after step (b), aging the wet layer of halogenated graphene after step (c), or aging the integrated layer of halogenated graphene after step (d), in an aging room at an aging temperature from 25° C. to 100° C. and humidity level from 20% to 99% for an aging time of 1 hour to 7 days.

The process may further comprise a compression step, during or after said step (d), to reduce a thickness of said integrated layer.

The process may further comprise a step (e) of heat treating the integrated layer of oriented halogenated graphene at a first heat treatment temperature higher than 100° C. but no greater than 3,200° C. for a desired length of time to produce a graphitic film having an inter-planar spacing $d_{002}$ less than 0.4 nm and a combined oxygen/halogen content less than 1% by weight.

The process may further comprise a compression step, during or after the heat treatment step, to reduce a thickness of the graphitic film.

In the invented process, the graphene oxide sheets in the graphene oxide dispersion preferably occupy a weight fraction of 0.1% to 25% based on the total weight of graphene oxide sheets and liquid medium combined. More preferably, the graphene oxide sheets in the graphene oxide dispersion occupy a weight fraction of 0.5% to 15%. In some embodiments, graphene oxide sheets occupy a weight proportion from 3% to 15% based on the total weight of graphene oxide sheets and liquid medium combined. In certain embodiments, the graphene oxide dispersion or graphene oxide gel has greater than 3% by weight of graphene oxide dispersed in the fluid medium to form a liquid crystal phase.

The graphene oxide dispersion or graphene oxide gel may be prepared by immersing a graphitic material in a powder or fibrous form in an oxidizing liquid in a reaction vessel at a reaction temperature for a length of time sufficient to obtain said graphene oxide dispersion or said graphene oxide gel wherein said graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

The graphene oxide dispersion or graphene oxide gel may be obtained from a graphitic material having a maximum original graphite grain size and the resulting halogenated graphene film is a poly-crystal graphene structure having a grain size larger than this maximum original grain size. This larger grain size is due to the notion that heat-treating of GO sheets, GO molecules, halogenated molecules, or halogenate sheets induces chemical linking, merging, or chemical bonding of graphene oxide/halide sheets or graphene oxide/halide molecules in an edge-to-edge manner. It may be noted that such an edge-to-edge linking significantly increases the length or width of graphene sheets or molecules. For instance, a graphene halide sheet 300 nm in length, if merged with a graphene halide sheet 400 nm in length could result in a sheet of approximately 700 nm in length. Such an edge-to-edge merging of multiple graphene halide sheets enables production of graphene films having huge grain sizes that could not be obtained otherwise.

In an embodiment, the graphene oxide dispersion or graphene oxide gel is obtained from a graphitic material having multiple graphite crystallites exhibiting no preferred crystalline orientation as determined by an X-ray diffraction or electron diffraction method and the resulting halogenated graphene film is a single crystal or a poly-crystal graphene structure having a preferred crystalline orientation as determined by said X-ray diffraction or electron diffraction method.

All the coating procedures capable of inducing shear stresses to the GO sheets or halogenated GO sheets may be implemented in the presently invented process; e.g. slot-die coating, comma coating, and reverse roll transfer coating. The reverse roll procedure is particularly effective in enabling the GO sheets or GO molecules to align themselves along a particular direction (e.g. X-direction or length-direction) or two particular directions (e.g. X- and Y-directions or length and width directions) to produce preferred orientations. Further surprisingly, these preferred orientations are preserved and often further enhanced during the subsequent heat treatment of the GO layers. Most surprisingly, such preferred orientations are essential to the eventual attainment of exceptionally high dielectric breakdown strength, dielectric constants, elastic modulus, and tensile strength of the resulting halogenated graphene film (even for thick films; e.g. from 10 nm to even >500 μm) along a desired direction. During the coating or casting processes, other than the presently invented reverse roll procedure-based process, the thickness of the coated or cast films (layers) cannot be too high (e.g. greater than 50 μm), otherwise a high degree of GO or halogenated sheet orientation cannot be achieved. In general, in the conventional casting or comma coating processes, the coated or cast films (wet layers) must be sufficiently thin so that when they become dried, they form a dried layer of graphene oxide having a thickness no greater than 50 μm, more typically no greater than 20 μm, and most typically no greater than 10 μm. Through extensive and in-depth experimental studies we have come to unexpectedly realize that the reverse roll procedure is so effective in achieving and maintaining a high degree of preferred orientation even for very thick films.

The integrated layer of oriented halogenated graphene herein produced typically has a dielectric constant greater than 4.0 (more typically greater than 5.0, often greater than 10, or even greater than 15), an electrical resistivity typically from $10^8$ Ω-cm to $10^{15}$ Ω-cm, and/or a dielectric breakdown strength greater than 5 MV/cm (more typically greater than 10 MV/cm, some greater than 12 MV/cm, and others even greater than 15 MV/cm) when measured at a layer thickness of 100 nm.

The present invention also provides a microelectronic device containing the integrated layer of halogenated graphene as a dielectric component.

This new class of materials (i.e., highly oriented GO-derived graphene halide films, GOGH) have the following characteristics that distinguish themselves from paper/film/membrane layers of discrete graphene/GO/RGO/GH sheets/platelets:

(1) This GOGH film is an integrated graphene halide (GH) entity that is a poly-crystalline structure composed of well-aligned, interconnected multiple grains with exceptionally large grain sizes. The HOGH has all the graphene planes in all the grains being essentially oriented parallel to one another (i.e., the crystallographic c-axis of all grains essentially pointing in an identical direction).

(2) With a reverse roll procedure, an exceptionally high degree of orientation of GH platelets can be achieved even with thick films (>10 nm), not just thin films. Given the same thickness, the reverse roll procedure enables a higher degree of orientation and higher degree of crystal perfection.

(3) The GOGH is an integrated graphene entity that is not a simple aggregate or stack of multiple discrete platelets of graphene/GO/RGO/GH (graphene halide), and does not contain any discernible or discrete flake/platelet derived from the original GO sheets.

These originally discrete flakes or platelets have been chemically bonded or linked together to form larger grains (grain size being larger than the original platelet/flake size).

(4) This GOGH is not made by using a binder or adhesive to glue discrete flakes or platelets together. Instead, under select aging or heat treatment conditions, well-aligned GO/GH sheets or GO/GH molecules are capable of chemically merging with one another mainly in an edge-to-edge manner to form giant 2-D graphene grains, but possibly also with adjacent GO/GH sheets below or above to form 3-D networks of graphene chains. Through joining or forming of covalent bonds with one another, the GO/GH sheets are adhered into an integrated graphene entity, without using any externally added linker or binder molecules or polymers.

(5) This GOGH, a poly-crystal with essentially all graphene planes having an identical crystallographic c-axis, is derived from GO, which is in turn obtained from moderate or heavy oxidation of natural graphite or artificial graphite particles each originally having multiple graphite crystallites that are randomly oriented. Prior to being chemically oxidized to become GO dispersion (moderate-to-heavy oxidation of graphite) or GO gel (heavy oxidation for a sufficiently long oxidation time to achieve fully separated GO molecules dissolved in water or other polar liquid), these starting or original graphite crystallites have an initial length ($L_a$ in the crystallographic a-axis direction), initial width ($L_b$ in the b-axis direction), and thickness ($L_c$ in the c-axis direction). The resulting GOGH typically has a length or width significantly greater than the $L_a$ and $L_b$ of the original graphite crystallites.

(6) This process for producing a monolithic, integrated layer of highly oriented GH sheets can be conducted on a continuous roll-to-roll basis and, hence, is a scalable, cost-effective process.

DESCRIPTION OF THE PREFERRED EMBODIMENTS

Figure 1:
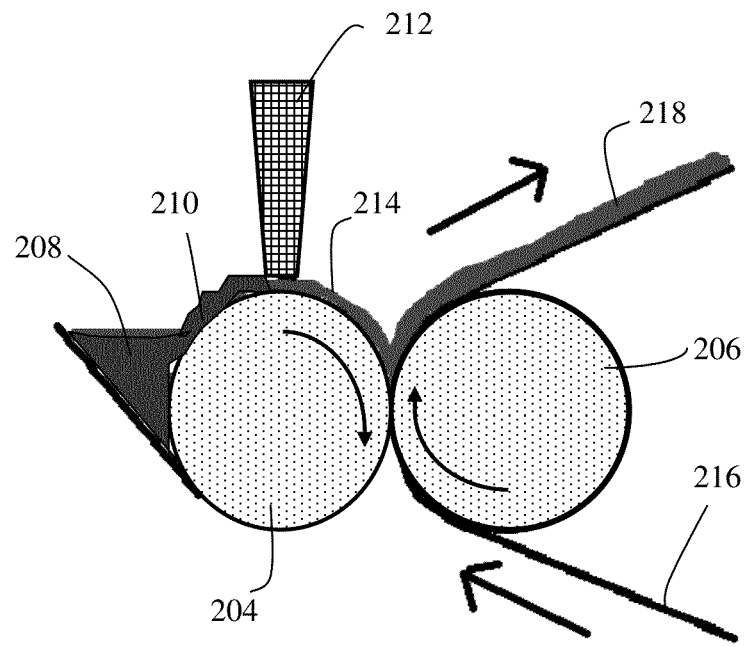
FIG. 1 Schematic of a reverse roll-based GO/GH layer transfer apparatus for producing highly oriented GO/GH films.

Provided is a process for producing a monolithic (single-material or single-phase) integrated layer of highly oriented halogenated graphene sheets or molecules, wherein the film has a thickness from 10 nm to 500 µm. The halogenated graphene has a chemical formula of $C_6Z_xO_y$, wherein Z is a halogen element selected from F, Cl, Br, I, or a combination thereof, x=from 0.01 to 6.0, y=from 0 to 5.0, and x+y≤6.0. The preparation of this integrated layer begins with graphene oxide (GO) in a suspension (dispersion) or gel form. Specifically, the process begins with (a) preparing either a graphene oxide (GO) dispersion having graphene oxide sheets dispersed in a fluid medium or a graphene oxide gel having graphene oxide molecules dissolved in a fluid medium, wherein the graphene oxide sheets or graphene oxide molecules contain an oxygen amount higher than 5% by weight (typically from 5% to 46%, but preferably from 10% to 46% and more preferably from 20% to 46%).

This is followed by step (b), which entails dispensing and depositing a layer of graphene oxide dispersion or graphene oxide gel onto a surface of a supporting substrate under a shear stress condition, wherein the dispensing and depositing procedure includes shear-induced thinning of graphene oxide dispersion or gel and shear-induced orientation of graphene oxide sheets or molecules, to form a wet layer of graphene oxide on the supporting substrate. This step includes spraying, printing, extruding, casting, and/or coating of a wet layer of GO onto a solid substrate surface (e.g. a PET film, Al foil, glass surface, etc.) that contains or is followed by a shearing procedure. The presence of a shear stress is essential to aligning GO sheets or molecules along a desired direction.

The third step, step (c), is then conducted to chemically replace O or oxygen-containing functional group with a halogen element or halogen-containing group. Halogen herein refers to F, Cl, Br, I, or a combination thereof. Thus, this step (c) entails introducing a halogenating agent into the wet layer of graphene oxide and effecting a chemical reaction between the halogenating agent and the graphene oxide sheets or molecules to form a wet layer of halogenated graphene having a chemical formula of $C_6Z_xO_y$, wherein Z is a halogen element selected from F, Cl, Br, I, or a combination thereof, x=0.01 to 6.0, y=0 to 5.0, and x+y≤6.0. The halogenating agent may contain a chemical species in a liquid, gaseous, or plasma state containing a halogen element selected from F, Cl, Br, I, or a combination thereof. Halogenated graphene is a group of graphene derivatives, in which some carbon atoms are covalently linked with halogen atoms. The carbon atoms linked with halogens have $sp^3$ hybridization and other carbon atoms have $sp^2$ hybridization. The physical and chemical properties of halogenated graphene (also referred to as graphene halide) are strongly dependent on the degree of halogenation.

Step (c) is then followed by step (d) of removing the fluid medium from the wet layer of halogenated graphene to form the integrated layer of halogenated graphene having an inter-planar spacing $d_{002}$ of 0.35 nm to 1.2 nm as determined by X-ray diffraction. The removal of liquid fluid may be conducted before, during, or after the halogenating reaction.

For accomplishing the halogenating reaction, for instance, hydrofluoric acid or hexafluorophosphoric acid ($HPF_6$) liquid may be injected into the GO suspension or GO gel stream before, during, or after the dispensing/depositing stage. Alternatively, $F_2$ gas, $Cl_2$ gas, $Br_2$ gas, and/or $I_2$ gas (vapor) may be introduced to a chamber where the wet GO layer is contained, enabling the halogen gas molecules to permeate into the wet GO layer and reacting with GO therein and thereon. Further alternatively, one may choose to remove the liquid medium from the wet layer of GO to form a dried layer of GO prior to introducing the halogenating agent to react with GO. The dried layer of GO may preferably be treated with halogen-containing gas or plasma.

Specifically, the fluorinating agent may be selected from hydrofluoric acid, hexafluorophosphoric acid or $HPF_6$, $XeF_2$, $F_2$ gas, $F_2$/Ar plasma, $CF_4$ plasma, $SF_6$ plasma, HCl, $HPCl_6$, $XeCl_2$, $Cl_2$ gas, $Cl_2$/Ar plasma, $CCl_4$ plasma, $SCl_6$ plasma, HBr, $XeBr_2$, $Br_2$ gas, $Br_2$/Ar plasma, $CBr_4$ plasma, $SBr_6$ plasma, HI, $XeI_2$, $I_2$, $I_2$/Ar plasma, $Cl_4$ plasma, $SI_6$ plasma, or a combination thereof.

A highly preferred dispensing and depositing procedure is the reverse roll transfer coating, which intrinsically induces high shear stresses to the suspension or gel coated on the rollers. As schematically illustrated in FIG. 1, as a preferred embodiment, the process of producing the monolithic, integrated layer of highly oriented graphene halide (HOGH) begins with preparation of a graphene oxide dispersion (GO dispersion) or graphene oxide gel (GO gel) that is delivered to a trough 208. The rotational motion of an application roller 204 in a first direction enables the delivery of a continuous layer 210 of GO dispersion or gel onto the exterior surface of the application roller 204. An optional doctor's blade 212 is used to regulate the thickness (amount) of an applicator layer 214 of graphene oxide (GO). This applicator layer is continuously delivered to the surface of a supporting film 216 moving in a second direction (e.g. driven by a counter-rotating roller 206, rotating in a direction opposite to the first direction) to form a wet layer 218 of graphene oxide. This wet layer of GO is then subjected to a liquid removal treatment (e.g. under a heating environment and/or being vacuum-pumped).

In summary, the process begins with preparation of either a graphene oxide dispersion having graphene oxide sheets dispersed in a fluid medium or a graphene oxide gel having graphene oxide molecules dissolved in a fluid medium, wherein the graphene oxide sheets or graphene oxide molecules contain an oxygen content higher than 5% by weight. The graphene oxide dispersion or graphene oxide gel is then dispensed and delivered onto a surface of an application roller rotating in a first direction at a first line velocity (the line speed at the external surface of the application roller) to form an applicator layer of graphene oxide and transferring this applicator layer of graphene oxide to a surface of a supporting film driven in a second direction opposite to the first direction at a second line velocity, forming a wet layer of graphene oxide on the supporting film.

In a preferred embodiment, the supporting film is driven by a counter-rotating supporting roller (e.g. 206 in FIG. 1) disposed at a working distance from the application roller and rotating in the second direction opposite to the first direction. The speed at the external surface of this supporting roller dictates the second line velocity (of the supporting film). Preferably, the supporting film is fed from a feeder roller and the dried layer of graphene oxide supported by the supporting film is wound on a winding roller and the process is conducted in a roll-to-roll manner.

Figure 2:
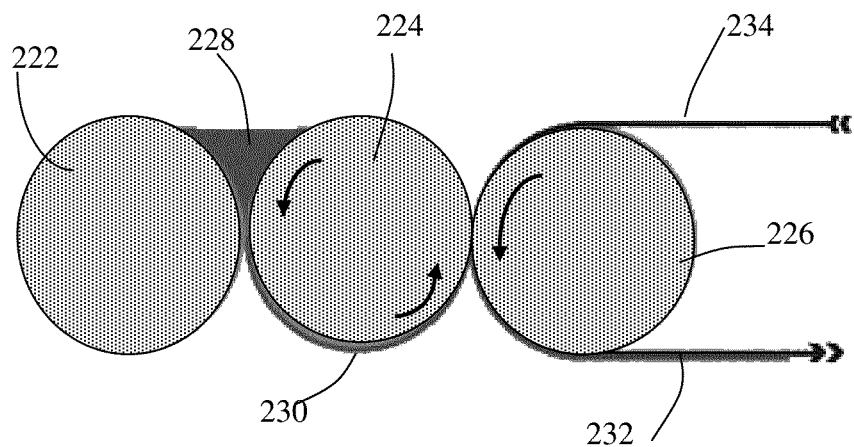
FIG. 2 Schematic of another reverse roll-based GO/GH layer transfer apparatus for producing highly oriented GO/GH films.
Figure 3:
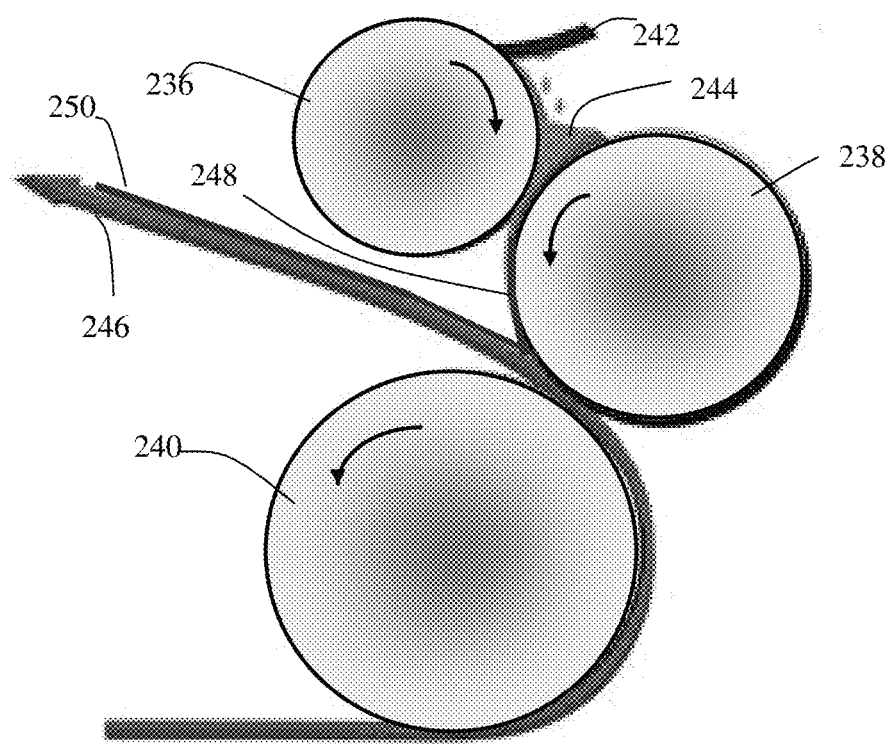
FIG. 3 Schematic of yet another reverse roll-based GO/GH layer transfer apparatus for producing highly oriented GO/GH films.
Figure 4:
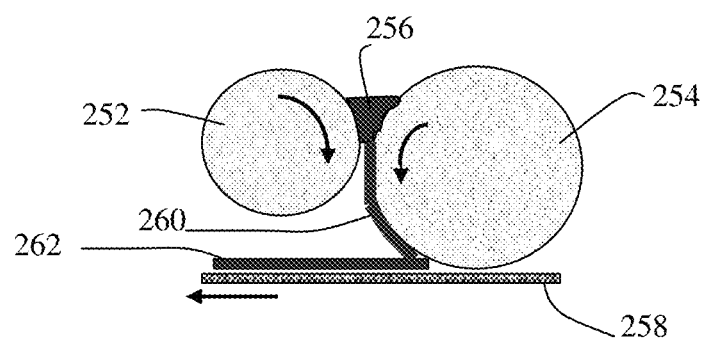
FIG. 4 Schematic of still another reverse roll-based GO/GH layer transfer apparatus for producing highly oriented GO/GH films.

This process is further illustrated in FIG. 2, FIG. 3, and FIG. 4. In a preferred embodiment, as illustrated in FIG. 2, the GO dispersion/gel trough 228 is naturally formed between an application roller 224 and a metering roller 222 (also referred to as a doctor's roller). The relative motion or rotation of the application roller 224, relative to the metering roller 222, at a desired speed generates an applicator layer 230 of GO on the exterior surface of the application roller 224. This applicator layer of GO is then transferred to form a wet layer 232 of GO on the surface of a supporting film 234 (driven by a supporting roller 226 counter-rotating in a direction opposite to the rotational direction of the applicator roller 224). The wet layer may then be subjected to halogenating and drying treatments.

In another preferred embodiment, as illustrated in FIG. 3, the GO dispersion/gel trough 244 is naturally formed between an application roller 238 and a metering roller 236. The relative motion or rotation of the application roller 238, relative to the metering roller 236, at a desired speed generates an applicator layer 248 of GO on the exterior surface of the application roller 238. A doctor's blade 242 may be used to scratch off any GO gel/dispersion carried on the exterior surface of the metering roller 236. This applicator layer 248 of GO is then transferred to form a wet layer 250 of GO on the surface of a supporting film 246 (driven by a supporting roller 240 counter-rotating in a direction opposite to the rotational direction of the applicator roller 238). The wet layer may then be subjected to halogenating and drying treatments.

In yet another preferred embodiment, as illustrated in FIG. 4, the GO dispersion/gel trough 256 is naturally formed between an application roller 254 and a metering roller 252. The relative motion or rotation of the application roller 254, relative to the metering roller 252, at a desired speed generates an applicator layer 260 of GO on the exterior surface of the application roller 254. This applicator layer 260 of GO is then transferred to form a wet layer 262 of GO on the surface of a supporting film 258, driven to move in a direction opposite to the tangential rotational direction of the applicator roller 254. This supporting film 258 may be fed from a feeder roller (not shown) and taken up (wound) on a winding roller (not shown), which may also be a driving roller. There would be at least 4 rollers in this example. The wet layer may then be subjected to halogenating and drying treatments. For liquid medium removal, there can be a heating zone after the wet layer of GO is formed to at least partially remove the liquid medium (e.g. water) from the wet layer to form a dried layer of GO.

In some embodiments, the step of dispensing the graphene oxide dispersion or graphene oxide gel onto the surface of the application roller includes using a metering roller and/or a doctor's blade to provide a desired thickness of the applicator layer of graphene oxide on the application roller surface. In general, the process includes operating 2, 3, or 4 rollers. Preferably, the process includes a reverse roll coating procedure.

It may be noted that the velocity ratio, defined as (the second line velocity)/(first line velocity), is from 1/5 to 5/1. If the external surface of the application roller moves at the same speed as the linear movement speed of the supporting film, then the velocity ratio is 1/1 or unity. If, as an example, the external surface of the application roller moves at a speed three times as fast as the linear movement speed of the supporting film, then the velocity ratio is 3/1. As a consequence, the transferred wet layer of GO would be approximately 3-fold in thickness as compared to the applicator layer of GO. Quite unexpectedly, this enables the production of much thicker layer yet still maintaining a high degree of GO orientation in the wet layer and the dried layer. This is a highly significant and desirable outcome since a high degree of GO sheet orientation could not be achieved with thick films (e.g. >50 µm in thickness) by using casting or other coating techniques, such as comma coating and slot-die coating. In certain embodiments, the velocity ratio is greater than 1/1 and less than 5/1. Preferably, the velocity ratio is greater than 1/1 and equal to or less than 3/1. The slot-die coating or comma coating is also capable of applying a shear stress to induce the required orientation of GO or GH sheets or molecules.

Preferably, the process further comprises a step of aging the wet or dried layer of graphene oxide in an aging room at an aging temperature from 25° C. to 200° C. (preferably from 25° C. to 100° C. and more preferably from 25° C. to 55° C.) and humidity level from 20% to 99% for an aging time of 1 hour to 7 days to form an aged layer of graphene oxide. We have surprisingly observed that this aging procedure enables some chemical linking or merging of GO sheets or molecules in an edge-to-edge manner, as manifested by the observation by microscopy that the average length/width of the GO sheets is significantly increased (by a factor of 2-3) after aging. This would make it possible to maintain the sheet orientation and accelerate subsequent edge-to-edge linking to huge grains or crystal domains.

In some embodiments, the process further comprises a step of heat treating the dried or dried and aged layer of graphene oxide at a first heat treatment temperature higher than 100° C. but no greater than 3,200° C. (preferably no greater than 2,500° C.) for a desired length of time to produce a film having an inter-planar spacing $d_{002}$ less than 0.4 nm and an oxygen and/or halogen content less than 5% by weight. The process can further comprise a compression step, during or after this heat-treating step, to reduce the thickness of the graphene film.

In the invented process, the graphene oxide sheets in the graphene oxide dispersion preferably occupy a weight fraction of 0.1% to 25% based on the total weight of graphene oxide sheets and liquid medium combined. More preferably, the graphene oxide sheets in the graphene oxide dispersion occupy a weight fraction of 0.5% to 15%. In some embodiments, graphene oxide sheets occupy a weight proportion from 3% to 15% based on the total weight of graphene oxide sheets and liquid medium combined. In certain embodiments, the graphene oxide dispersion or graphene oxide gel has greater than 3% by weight of graphene oxide dispersed in the fluid medium to form a liquid crystal phase.

The monolithic integrated halogenated graphene film contains chemically bonded and merged graphene planes. These planar aromatic molecules or graphene planes (hexagonal structured carbon atoms having a desired amount of oxygen- and/or halogen-containing group) are parallel to one another. The lateral dimensions (length or width) of these planes are huge, typically several times or even orders of magnitude larger than the maximum crystallite dimension (or maximum constituent graphene plane dimension) of the starting graphite particles. The presently invented halogenated graphene film is a "giant graphene crystal" or "giant planar graphene particle" having all constituent graphene planes being essentially parallel to one another. This is a unique and new class of material that has not been previously discovered, developed, or suggested to possibly exist.

The dried graphene halide (GH) layer has a high birefringence coefficient between an in-plane direction and the normal-to-plane direction. The oriented graphene oxide and/or halide layer is itself a very unique and novel class of material that surprisingly has great cohesion power (self-bonding, self-polymerizing, and self-crosslinking capability). These characteristics have not been taught or hinted in the prior art. The GO is obtained by immersing powders or filaments of a starting graphitic material in an oxidizing liquid medium (e.g. a mixture of sulfuric acid, nitric acid, and potassium permanganate) in a reaction vessel. The starting graphitic material may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

When the starting graphite powders or filaments are mixed in the oxidizing liquid medium, the resulting slurry is a heterogeneous suspension and appears dark and opaque. When the oxidation of graphite proceeds at a reaction temperature for a sufficient length of time, the reacting mass can eventually become a suspension that appears slightly green and yellowish, but remain opaque. If the degree of oxidation is sufficiently high (e.g. having an oxygen content between 20% and 50% by weight, preferably between 30% and 50%) and all the original graphene planes are fully oxidized, exfoliated and separated to the extent that each oxidized graphene plane (now a graphene oxide sheet or molecule) is surrounded by the molecules of the liquid medium, one obtains a GO gel. The GO gel is optically translucent and is essentially a homogeneous solution, as opposed to a heterogeneous suspension.

This GO suspension or GO gel typically contains some excess amount of acids and can be advantageously subjected to some acid dilution treatment to increase the pH value (preferably >4.0). The GO suspension (dispersion) preferably contain at least 1% by weight of GO sheets dispersed in a liquid medium, more preferably at least 3% by weight, and most preferably at least 5% by weight. It is advantageous to have an amount of GO sheets sufficient for forming a liquid crystalline phase. We have surprisingly observed that GO sheets in a liquid crystal state have the highest tendency to get readily oriented under the influence of a shear stress created by a commonly used casting or coating process.

The graphene oxide suspension may be prepared by immersing a graphitic material (in a powder or fibrous form) in an oxidizing liquid to form a reacting slurry in a reaction vessel at a reaction temperature for a length of time sufficient to obtain GO sheets dispersed in a residual liquid. Typically, this residual liquid is a mixture of acid (e.g. sulfuric acid) and oxidizer (e.g. potassium permanganate or hydrogen peroxide). This residual liquid is then washed and replaced with water and/or alcohol to produce a GO dispersion wherein discrete GO sheets (single-layer or multi-layer GO) are dispersed in the fluid. The dispersion is a heterogeneous suspension of discrete GO sheets suspended in a liquid medium and it looks optically opaque and dark (relatively low degree of oxidation) or slightly green and yellowish (if the degree of oxidation is high).

Now, if the GO sheets contain a sufficient amount of oxygen-containing functional groups and the resulting dispersion (suspension or slurry) is mechanically sheared or ultrasonicated to produce individual GO sheets or molecules that are dissolved (not just dispersed) in water and/or alcohol or other polar solvent, we can reach a material state called "GO gel" in which all individual GO molecules are surrounded by the molecules of the liquid medium. The GO gel looks like a homogeneous solution which is translucent and no discernible discrete GO or graphene sheets can be visibly identified. Useful starting graphitic materials include natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. As the oxidizing reaction proceeds to a critical extent and individual GO sheets are fully separated (now with graphene plane and edges being heavily decorated with oxygen-containing groups), an optically transparent or translucent solution is formed, which is the GO gel.

Preferably, the GO sheets in such a GO dispersion or the GO molecules in such a GO gel are in the amount of 1%-15% by weight, but can be higher or lower. More preferably, the GO sheets are 2%-10% by weight in the suspension. Most preferably, the amount of GO sheets is sufficient to form a liquid crystal phase in the dispersing liquid. The GO sheets have an oxygen content typically in the range from 5% to 50% by weight, more typically from 10% to 50%, and most typically from 20% to 46% by weight.

The aforementioned features are further described and explained in detail as follows: As illustrated in FIG. 5(B), a graphite particle (e.g. 100) is typically composed of multiple graphite crystallites or grains. A graphite crystallite is made up of layer planes of hexagonal networks of carbon atoms. These layer planes of hexagonally arranged carbon atoms are substantially flat and are oriented or ordered so as to be substantially parallel and equidistant to one another in a particular crystallite. These layers of hexagonal-structured carbon atoms, commonly referred to as graphene layers or basal planes, are weakly bonded together in their thickness direction (crystallographic c-axis direction) by weak van der Waals forces and groups of these graphene layers are arranged in crystallites. The graphite crystallite structure is usually characterized in terms of two axes or directions: the c-axis direction and the a-axis (or b-axis) direction. The c-axis is the direction perpendicular to the basal planes. The a- or b-axes are the directions parallel to the basal planes (perpendicular to the c-axis direction).

A highly ordered graphite particle can consist of crystallites of a considerable size, having a length of $L_a$ along the crystallographic a-axis direction, a width of $L_b$ along the crystallographic b-axis direction, and a thickness $L_c$ along the crystallographic c-axis direction. The constituent graphene planes of a crystallite are highly aligned or oriented with respect to each other and, hence, these anisotropic structures give rise to many properties that are highly directional. For instance, the thermal and electrical conductivity of a crystallite are of great magnitude along the plane directions (a- or b-axis directions), but relatively low in the perpendicular direction (c-axis). As illustrated in the upper-left portion of FIG. 5(B), different crystallites in a graphite particle are typically oriented in different directions and, hence, a particular property of a multi-crystallite graphite particle is the directional average value of all the constituent crystallites.

Due to the weak van der Waals forces holding the parallel graphene layers, natural graphite can be treated so that the spacing between the graphene layers can be appreciably opened up so as to provide a marked expansion in the c-axis direction, and thus form an expanded graphite structure in which the laminar character of the carbon layers is substantially retained. The process for manufacturing flexible graphite is well-known in the art. In general, flakes of natural graphite (e.g. 100 in FIG. 5(B)) are intercalated in an acid solution to produce graphite intercalation compounds (GICs, 102). The GICs are washed, dried, and then exfoliated by exposure to a high temperature for a short period of time. This causes the flakes to expand or exfoliate in the c-axis direction of the graphite up to 80-300 times of their original dimensions. The exfoliated graphite flakes are vermiform in appearance and, hence, are commonly referred to as worms 104. These worms of graphite flakes which have been greatly expanded can be formed without the use of a binder into cohesive or integrated sheets of expanded graphite, e.g. webs, papers, strips, tapes, foils, mats or the like (typically referred to as "flexible graphite" 106) having a typical density of about 0.04-2.0 g/cm³ for most applications.

Figure 5A:
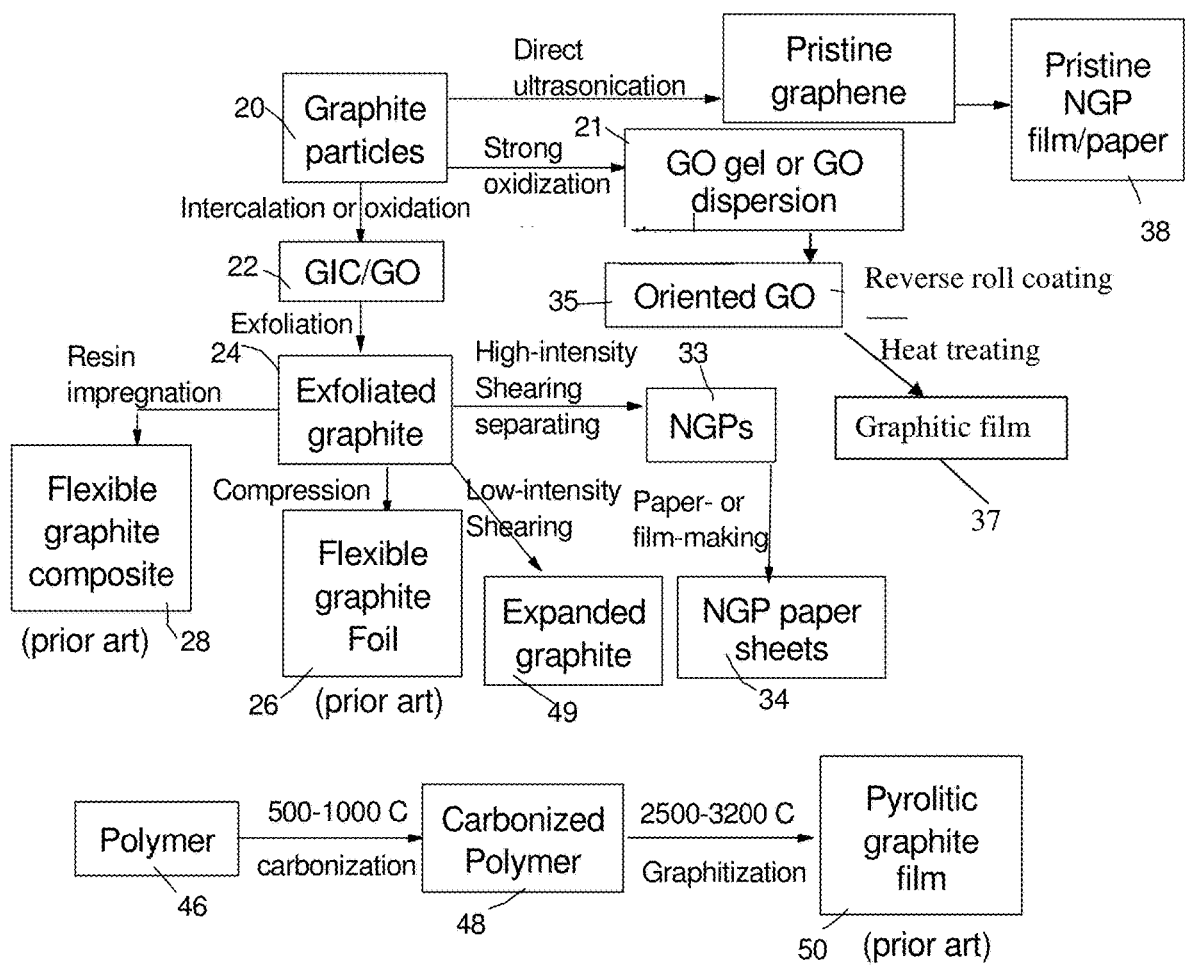
FIG. 5(A) A flow chart illustrating various prior art processes of producing exfoliated graphite products (flexible graphite foils and flexible graphite composites) and pyrolytic graphite (bottom portion), along with a process for producing graphene oxide gel or GO dispersion.
Figure 5B:
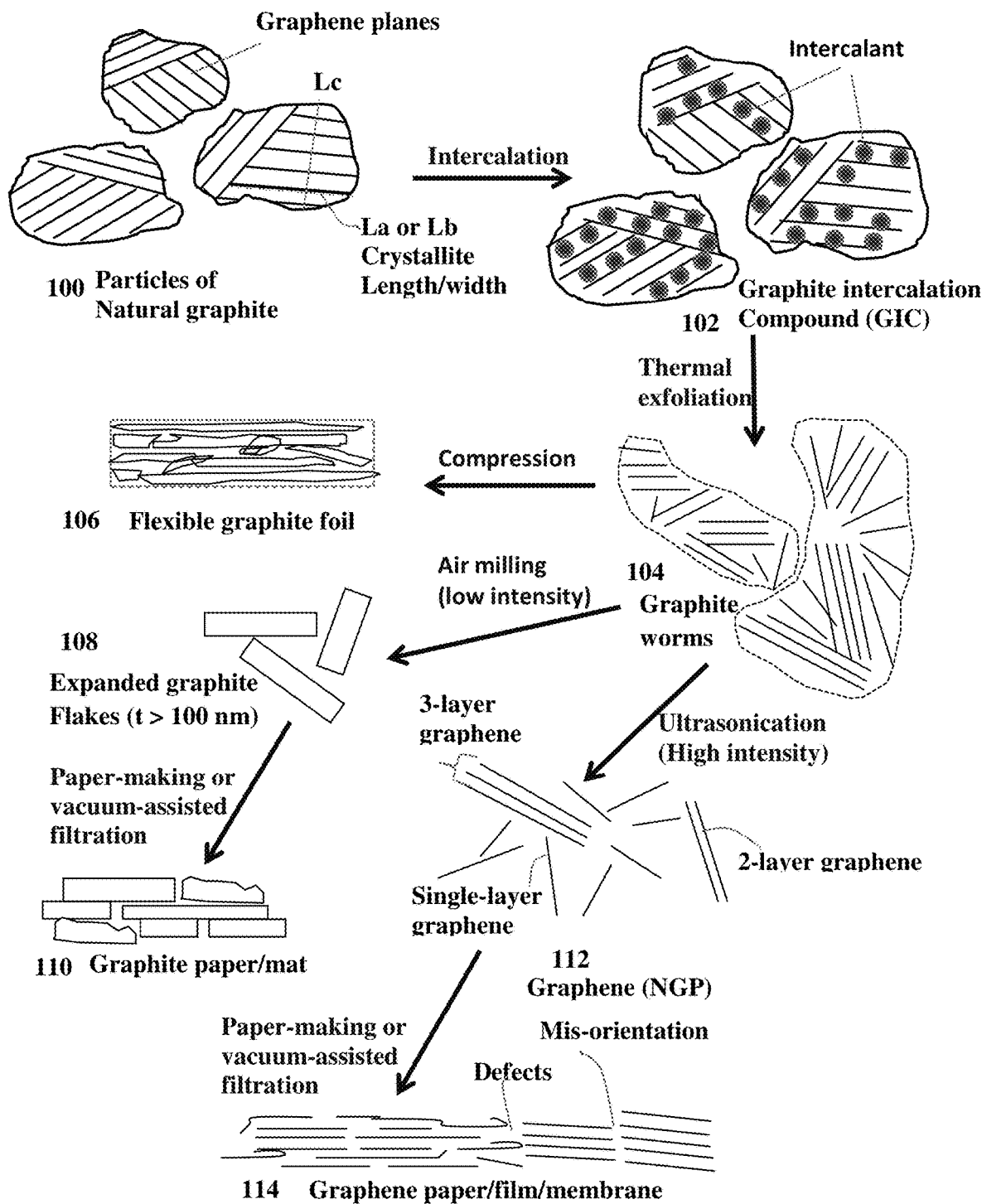
FIG. 5(B) Schematic drawing illustrating the processes for producing conventional paper, mat, film, and membrane of simply aggregated graphite or NGP flakes/platelets. All processes begin with intercalation and/or oxidation treatment of graphitic materials (e.g. natural graphite particles).

The upper left portion of FIG. 5(A) shows a flow chart that illustrates the prior art processes used to fabricate flexible graphite foils and the resin-impregnated flexible graphite composite. The processes typically begin with intercalating graphite particles 20 (e.g., natural graphite or synthetic graphite) with an intercalant (typically a strong acid or acid mixture) to obtain a graphite intercalation compound 22 (GIC). After rinsing in water to remove excess acid, the GIC becomes "expandable graphite." The GIC or expandable graphite is then exposed to a high temperature environment (e.g., in a tube furnace preset at a temperature in the range of 800-1,050° C.) for a short duration of time (typically from 15 seconds to 2 minutes). This thermal treatment allows the graphite to expand in its c-axis direction by a factor of 30 to several hundreds to obtain a worm-like vermicular structure 24 (graphite worm), which contains exfoliated, but un-separated graphite flakes with large pores interposed between these interconnected flakes. An example of graphite worms is presented in FIG. 6(A).

In one prior art process, the exfoliated graphite (or mass of graphite worms) is re-compressed by using a calendaring or roll-pressing technique to obtain flexible graphite foils (26 in FIG. 5(A) or 106 in FIG. 5(B)), which are typically 100-300 µm thick. An SEM image of a cross-section of a flexible graphite foil is presented in FIG. 6(B), which shows many graphite flakes with orientations not parallel to the flexible graphite foil surface and there are many defects and imperfections.

Largely due to these mis-orientations of graphite flakes and the presence of defects, commercially available flexible graphite foils normally have an in-plane electrical conductivity of 1,000-3,000 S/cm, through-plane (thickness-direction or Z-direction) electrical conductivity of 15-30 S/cm, in-plane thermal conductivity of 140-300 W/mK, and through-plane thermal conductivity of approximately 10-30 W/mK. These defects and mis-orientations are also responsible for the low mechanical strength (e.g. defects are potential stress concentration sites where cracks are preferentially initiated). These properties are inadequate for many thermal management applications and the present invention is made to address these issues.

In another prior art process, the exfoliated graphite worm 24 may be impregnated with a resin and then compressed and cured to form a flexible graphite composite 28, which is normally of low strength as well. In addition, upon resin impregnation, the electrical and thermal conductivity of the graphite worms could be reduced by two orders of magnitude.

Alternatively, the exfoliated graphite may be subjected to high-intensity mechanical shearing/separation treatments using a high-intensity air jet mill, high-intensity ball mill, or ultrasonic device to produce separated nano graphene platelets 33 (NGPs) with all the graphene platelets thinner than 100 nm, mostly thinner than 10 nm, and, in many cases, being single-layer graphene (also illustrated as 112 in FIG. 5(B)). An NGP is composed of a graphene sheet or a plurality of graphene sheets with each sheet being a two-dimensional, hexagonal structure of carbon atoms.

Further alternatively, with a low-intensity shearing, graphite worms tend to be separated into the so-called expanded graphite flakes (108 in FIG. 5(B) having a thickness>100 nm. These flakes can be formed into graphite paper or mat 106 using a paper- or mat-making process. This expanded graphite paper or mat 106 is just a simple aggregate or stack of discrete flakes having defects, interruptions, and mis-orientations between these discrete flakes.

For the purpose of defining the geometry and orientation of an NGP, the NGP is described as having a length (the largest dimension), a width (the second largest dimension), and a thickness. The thickness is the smallest dimension, which is no greater than 100 nm, preferably smaller than 10 nm in the present application. When the platelet is approximately circular in shape, the length and width are referred to as diameter. In the presently defined NGPs, both the length and width can be smaller than 1 µm, but can be larger than 200 µm.

Figure 7A:
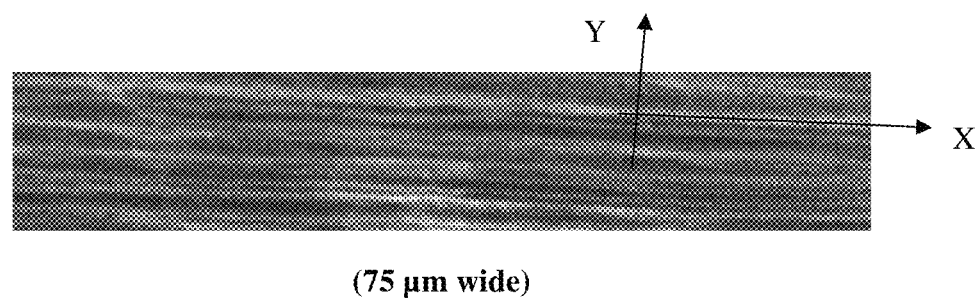
FIG. 7(A) A SEM image of a GO-derived film, wherein multiple graphene planes (having an initial length/width of 30 nm-300 nm in original graphite particles) have been oxidized, exfoliated, re-oriented, and seamlessly merged into continuous-length graphene sheets or layers that can run for tens of centimeters wide or long (only a 50 μm width of a 10-cm wide graphitic film being shown in this SEM image).
Figure 7B:
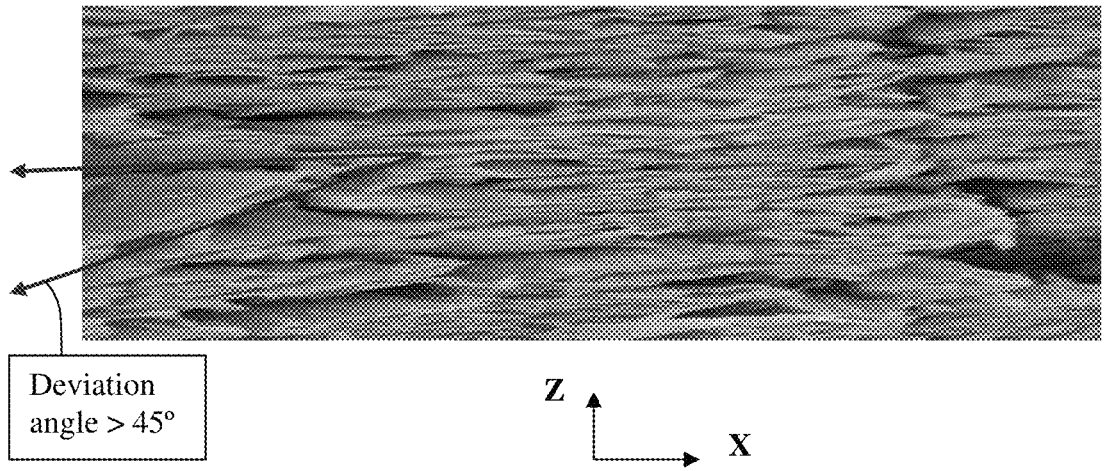
FIG. 7(B) A SEM image of a cross-section of a conventional graphene paper/film prepared from discrete graphene sheets/platelets using a paper-making process (e.g. vacuum-assisted filtration). The image shows many discrete graphene sheets being folded or interrupted (not integrated), with orientations not parallel to the film/paper surface and having many defects or imperfections.
Figure 7C:
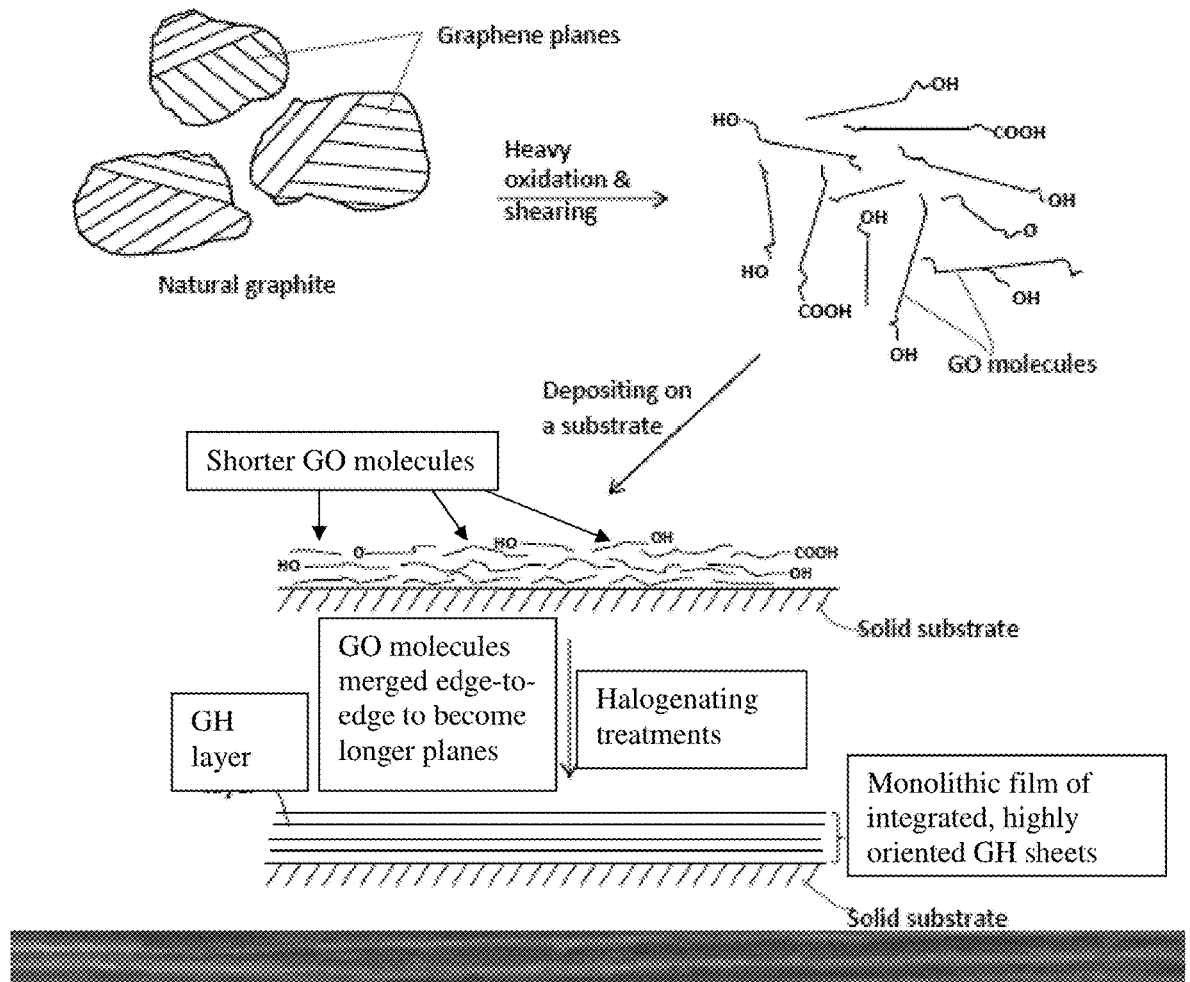
FIG. 7(C) Schematic drawing and an attendant SEM image to illustrate the formation process of a HOGF that is composed of multiple graphene planes that are parallel to one another and are chemically bonded in the thickness-direction or crystallographic c-axis direction.

A mass of multiple NGPs (including discrete sheets/platelets of single-layer and/or few-layer graphene or graphene oxide, 33 in FIG. 5(A)) may be made into a graphene film/paper (34 in FIG. 5(A) or 114 in FIG. 5(B)) using a film- or paper-making process. FIG. 7(B) shows a SEM image of a cross-section of a graphene paper/film prepared from discrete graphene sheets using a paper-making process. The image shows the presence of many discrete graphene sheets being folded or interrupted (not integrated), most of platelet orientations being not parallel to the film/paper surface, the existence of many defects or imperfections. NGP aggregates, even when being closely packed, exhibit a thermal conductivity higher than 1,000 W/mK only when the film or paper is cast and strongly pressed into a sheet having a thickness lower than 10 µm. A heat spreader in many electronic devices is normally required to be thicker than 10 µm but thinner than 35 µm).

Another graphene-related product is the graphene oxide gel 21 (FIG. 5(A)). This GO gel is obtained by immersing a graphitic material 20 in a powder or fibrous form in a strong oxidizing liquid in a reaction vessel to form a suspension or slurry, which initially is optically opaque and dark. This optical opacity reflects the fact that, at the outset of the oxidizing reaction, the discrete graphite flakes and, at a later stage, the discrete graphene oxide flakes scatter and/or absorb visible wavelengths, resulting in an opaque and generally dark fluid mass. If the reaction between graphite powder and the oxidizing agent is allowed to proceed at a sufficiently high reaction temperature for a sufficient length of time and all the resulting GO sheets are fully separated, this opaque suspension is transformed into a brown-colored and typically translucent or transparent solution, which is now a homogeneous fluid called "graphene oxide gel" (21 in FIG. 5(A)) that contains no discernible discrete graphite flakes or graphite oxide platelets. If dispensed and deposited using the presently invented reverse roll coating, the GO gel undergoes molecular orientation to form a layer of highly oriented GO 35, which can be heat-treated to become a graphitic film 37.

Again, typically, this graphene oxide gel is optically transparent or translucent and visually homogeneous with no discernible discrete flakes/platelets of graphite, graphene, or graphene oxide dispersed therein. In the GO gel, the GO molecules are uniformly "dissolved" in an acidic liquid medium. In contrast, suspension of discrete graphene sheets or graphene oxide sheets in a fluid (e.g. water, organic acid or solvent) look dark, black or heavy brown in color with individual graphene or graphene oxide sheets discernible or recognizable even with naked eyes or using a low-magnification light microscope (100×-1,000×).

Even though graphene oxide suspension or GO gel is obtained from a graphitic material (e.g. powder of natural graphite) having multiple graphite crystallites exhibiting no preferred crystalline orientation, as determined by an X-ray diffraction or electron diffraction method, the resulting graphitic film exhibits a very high degree of preferred crystalline orientation as determined by the same X-ray diffraction or electron diffraction method. This is yet another piece of evidence to indicate that the constituent graphene planes of hexagonal carbon atoms that constitute the particles of the original or starting graphitic material have been chemically modified, converted, re-arranged, re-oriented, linked or cross-linked, merged and integrated, and halogenated.

Example 1: Preparation of Discrete Oxidized Nano Graphene Platelets (NGPs) or GO Sheets Chopped graphite fibers with an average diameter of 12 μm and natural graphite particles were separately used as a starting material, which was immersed in a mixture of concentrated sulfuric acid, nitric acid, and potassium permanganate (as the chemical intercalate and oxidizer) to prepare graphite intercalation compounds (GICs). The starting material was first dried in a vacuum oven for 24 h at 80° C. Then, a mixture of concentrated sulfuric acid, fuming nitric acid, and potassium permanganate (at a weight ratio of 4:1:0.05) was slowly added, under appropriate cooling and stirring, to a three-neck flask containing fiber segments. After 5-16 hours of reaction, the acid-treated graphite fibers or natural graphite particles were filtered and washed thoroughly with deionized water until the pH level of the solution reached 6. After being dried at 100° C. overnight, the resulting graphite intercalation compound (GIC) or graphite oxide fiber was re-dispersed in water and/or alcohol to form a slurry.

In one sample, 500 grams of the graphite oxide fibers were mixed with 2,000 ml alcohol solution consisting of alcohol and distilled water with a ratio of 15:85 to obtain a slurry mass. Then, the mixture slurry was subjected to ultrasonic irradiation with a power of 200 W for various lengths of time. After 20 minutes of sonication, GO fibers were effectively exfoliated and separated into thin graphene oxide sheets with oxygen content of approximately 23%-31% by weight.

The reverse roll transfer procedure was then followed to make the resulting suspension into thin films and thick films of GO (10 nm, 100 nm, 1-25 μm, 100 μm, and 500 μm in thickness), on a polyethylene terephthalate (PET) film. For comparison purposes, GO layers of a comparable thickness range were also prepared by drop-casting and Comma coating techniques.

For making halogenated graphene films, several GO films were subjected to aging and halogenating treatments that typically involve an aging temperature of 30-100° C. for 1-8 hours, followed by halogenating treatment at 25-250° C. for 1-24 hours.

Example 2: Preparation of Single-Layer Graphene Oxide Sheets from Meso-Carbon Micro-Beads (MCMBs)

Meso-carbon microbeads (MCMBs) were supplied from China Steel Chemical Co., Kaohsiung, Taiwan. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 48-96 hours. Upon completion of the reaction, the mixture was poured into deionized water and filtered. The intercalated MCMBs were repeatedly washed in a 5% solution of HCl to remove most of the sulphate ions. The sample was then washed repeatedly with deionized water until the pH of the filtrate was no less than 4.5. The slurry was then subjected ultrasonication for 10-100 minutes to produce GO suspensions. TEM and atomic force microscopic studies indicate that most of the GO sheets were single-layer graphene when the oxidation treatment exceeded 72 hours, and 2- or 3-layer graphene when the oxidation time was from 48 to 72 hours.

The GO sheets contain oxygen proportion of approximately 35%-47% by weight for oxidation treatment times of 48-96 hours. The suspension was then coated onto a PET polymer surface using a reverse roll transfer coating and separately, a comma coating procedure to form oriented GO films. The resulting GO films, after removal of liquid, have a thickness that can be varied from approximately 0.5 to 500 μm. Halogenation treatments were conducted before (using HF acid) and after the dispensing step (e.g. $F_2$ and $Br_2$ plasma, further discussed later).

Example 3: Preparation of Graphene Oxide (GO) Suspension and GO Gel from Natural Graphite Graphite oxide was prepared by oxidation of graphite flakes with an oxidizer liquid consisting of sulfuric acid, sodium nitrate, and potassium permanganate at a ratio of 4:1:0.05 at 30° C. When natural graphite flakes (particle sizes of 14 μm) were immersed and dispersed in the oxidizer mixture liquid for 48 hours, the suspension or slurry appears and remains optically opaque and dark. After 48 hours, the reacting mass was rinsed with water 3 times to adjust the pH value to at least 3.0. A final amount of water was then added to prepare a series of GO-water suspensions. We observed that GO sheets form a liquid crystal phase when GO sheets occupy a weight fraction >3% and typically from 5% to 15%.

For comparison purposes, we also have prepared GO gel samples by extending the oxidation times to approximately 96 hours. With continued heavy oxidation, the dark-colored, opaque suspension obtained with 48 hours of oxidation turns into a brown-yellowish solution that is translucent upon rinsing with some water.

By dispensing and coating the GO suspension or the GO gel on a PET film, using both reverse roll coating and slot-die coating, and removing the liquid medium from the coated film we obtained a thin film of dried graphene oxide. GO films were then subjected to different heat and halogenation treatments. The heat treatments typically include an aging treatment at 45° C. to 150° C. for 1-10 hours. The halogenation treatments are discussed in Examples 4 and 5.

Scanning electron microscopy (SEM), transmission electron microscopy (TEM) pictures of lattice imaging of the graphene layer, as well as selected-area electron diffraction (SAD), bright field (BF), and dark-field (DF) images were also conducted to characterize the structure of integrated layer of halogenated graphene materials. For measurement of cross-sectional views of the film, the sample was buried in a polymer matrix, sliced using an ultra-microtome, and etched with Ar plasma.

Figure 6A:
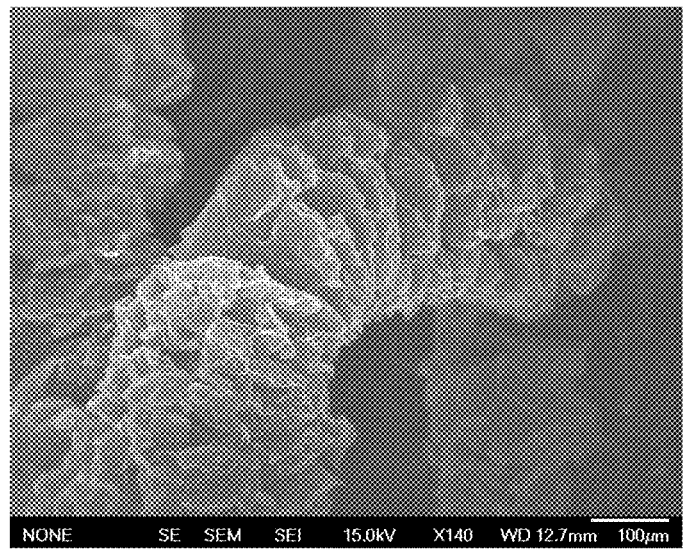
FIG. 6(A) A SEM image of a graphite worm sample after thermal exfoliation of graphite intercalation compounds (GICs) or graphite oxide powders.
Figure 6B:
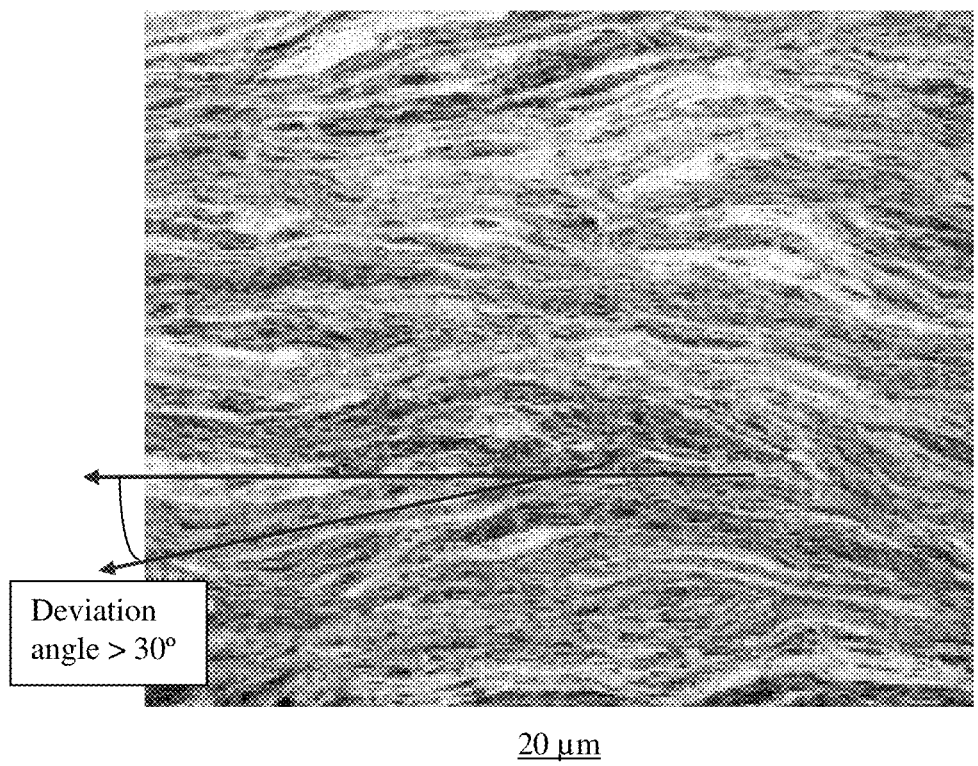
FIG. 6(B) An SEM image of a cross-section of a flexible graphite foil, showing many graphite flakes with orientations not parallel to the flexible graphite foil surface and also showing many defects, kinked or folded flakes.

A close scrutiny and comparison of FIG. 6(A), FIG. 6(A), and FIG. 7(B) indicates that the graphene layers in a halogenated GO film herein produced are substantially oriented parallel to one another; but this is not the case for flexible graphite foils and GO or GH paper. The inclination angles between two identifiable layers in the integrated film of halogenated graphene are mostly less than 5 degrees. In contrast, there are so many folded graphite flakes, kinks, and mis-orientations in flexible graphite that many of the angles between two graphite flakes are greater than 10 degrees, some as high as 45 degrees (FIG. 6(B)). Although not nearly as bad, the mis-orientations between graphene platelets in graphene paper (FIG. 7(B)) are also high (average>>10-20°) and there are many gaps between platelets. The integrated halogenated graphene film is essentially gap-free.

Example 4: Halogenating Treatments of GO after Deposition of a GO Layer

Chlorination of GO platelets was conducted with chloroform (CF) and, separately, with chlorobenzene (CB) at a temperature of 50-100° C. for 1-10 hours. The extent of chlorination of GO was evaluated by Raman spectroscopy and X-ray photoelectron spectroscopy (XPS). In order to determine the effect of CF or CB treatment on the dielectric performance of the resulting chlorinated GO, films of approximately 70 nm to 2 μm in thickness were prepared.

The fluorination of reduced graphene oxide sheets (mono- and multilayered) can be conducted in plasmas containing $CF_4$, $SF_6$, $XeF_2$, fluoropolymers, or $Ar/F_2$ as fluorinating agents. The fluorine content of the resulting fluorinated graphene can be varied by changing the plasma treatment time as well as the fluorinating agent type.

A number of techniques were used to fluorinate graphene oxide, including exposure to $F_2$ gas at moderate temperatures (400-600° C.) and treatment with F-based plasmas. $XeF_2$ is a strong fluorinating agent for graphene oxide without etching, thereby providing a facile route for graphene halogenation. Characterization of this process via X-ray photoelectron spectroscopy (XPS) and Raman spectroscopy reveals room-temperature fluorination saturates 25-50% coverage (corresponding to a formula $C_4F$—$C_2F$) for single-sided exposure and CF for double-sided exposure. Due to its high electronegativity, fluorine induces strong chemical shifts in the carbon is binding energy allowing the use of X-ray photoelectron spectroscopy (XPS) to quantify composition and bonding type.

Fluorination was also conducted in a plasma-enhanced chemical vapor deposition (PECVD). In a typical procedure, a PECVD chamber was evacuated to approximately 5 mTorr, and the temperature was increased from room temperature to 200° C. The $CF_4$ gas was then introduced into the chamber at controlled gas flow rates and pressures. The degree of fluorination of the GO sample was adjusted by varying the exposure time. A suitable $CF_4$ plasma exposure time was found to be from 3 to 7 minutes per nm of Go layer thickness. For instance, for a GO layer 10 nm thick, the exposure time was 30 to 70 minutes. Bromination and iodination of Go was conducted by similar procedures using $Br_2$, $I_2$, BrI, $CBr_4$, and/or $CCl_4$ gas or plasma under comparable conditions.

Example 5: Preparation of Various Halogenated Graphene Oxide Sheets/Molecules Prior to the Dispensing and Deposition Step Graphene fluoride suspensions were obtained by chemically etching graphite fluoride particles (commercially available) via sonication in the presence of sulfolane, dimethylformamide (DMF), or N-methyl-2-pyrrolidone (NMP). In this process, the solvent molecules intercalate within the inter-graphene layers, weakening the van der Waals forces between neighboring layers and facilitating the exfoliation of graphite fluoride into graphene fluoride suspension. The GF suspension could be directly coated onto the surface of a PET film using comma coating, slot-die coating, or, preferably, reverse roll transfer coating under a high shear condition (e.g. a higher line speed ratio, 2/1 to 5/1).

Graphene fluoride with different fluorine contents could be readily obtained by the chemical reaction of graphene oxide with hydrofluoric acid. Fluorination of graphene oxide can be done by exposing graphene oxide to anhydrous HF vapors at various temperatures or photochemically at room temperature using HF solution. These procedures were conducted on GO sheets or molecules prior to the step of dispensing and depositing.

Both single-layer and few-layer graphene can be chlorinated up to 56-74 wt. % by irradiation with UV light in a liquid chlorine medium. The bromination of both single-layer and few-layer graphene can be conducted under comparable conditions.

As examples, GO (15 mg) was mixed in 30 mL of carbon tetrachloride and sonicated for 20 min using a tip-style ultrasonicator. The suspension obtained was transferred to a 500 mL quartz vessel which was fitted with a condenser maintained at 277° C. The reaction chamber was purged with high purity nitrogen for 30 min and chlorine gas was passed through the chamber. The gaseous chlorine condensed in the quartz vessel. The quartz vessel containing around 20 mL of liquid chlorine was heated to 250° C. with simultaneous irradiation of UV light (250 Watt high pressure Hg vapor lamp) for 1.5 h. The solvent and excess chlorine was removed, leaving a transparent film on the walls of the quartz vessel. The solid was dispersed in absolute alcohol under ultrasonication, filtered and washed with distilled water and absolute alcohol. The filtrate was then re-dispersed in 40 ml of distilled water, ultrasonicated for 2 min and centrifuged. The black supernatant obtained was separated and filtered using a PVDF membrane (200 nm pore size). The yield from the 15 mg GO sample was around 7-10 mg. The chlorinated graphene sheets can be dispersed in a solvent (e.g. $CCl_4$) to form a suspension for dispensing and depositing.

In the case of bromination, 12 mg of graphene was mixed in the quartz vessel, to which 20 mL of liquid bromine was added. The mixture was sonicated for 10 min using an ultrasonicator. To this 0.5 g of carbon tetrabromide was added. The quartz vessel was then heated to 250° C. with simultaneous irradiation of UV light just as in chlorination. The excess bromine was removed and the product washed with sodium thiosulfate. The solid residue was then washed with water and absolute alcohol several times to remove sodium thiosulfate and then dispersed in 40 mL distilled water and centrifuged. The black supernatant obtained was separated and filtered using a PVDF membrane (200 nm pore size). The yield from the 12 mg sample was around 5-7 mg. The brominated graphene sheets can be dispersed in a solvent (e.g. $CBr_4$) to form a suspension for dispensing and depositing.

A desired amount of halogenated GO sheets/molecules can be added to a GO suspension or GO gel to produce a GO/halogenated GO mixture suspension or gel prior to the dispensing/depositing step. Typically, a halogenated GO-to-GO weight ratio is from 10/1 to 1/10 (in selected liquid medium, such as DMF and NMP), more typically from 1/1 to 1/10 (if the liquid medium is water).

Example 6: Properties of Integrated Layers of Halogenated Graphene

The measurement methods for dielectric strength, dielectric constant, volumetric resistivity (reciprocal of electric conductivity) are well-known in the art. Standardized methods were followed in the present study: dielectric strength (ASTM D-149-91), dielectric constant (ASTM D-150-92), and volume resistivity (ASTM D-257-91).

Figure 8:
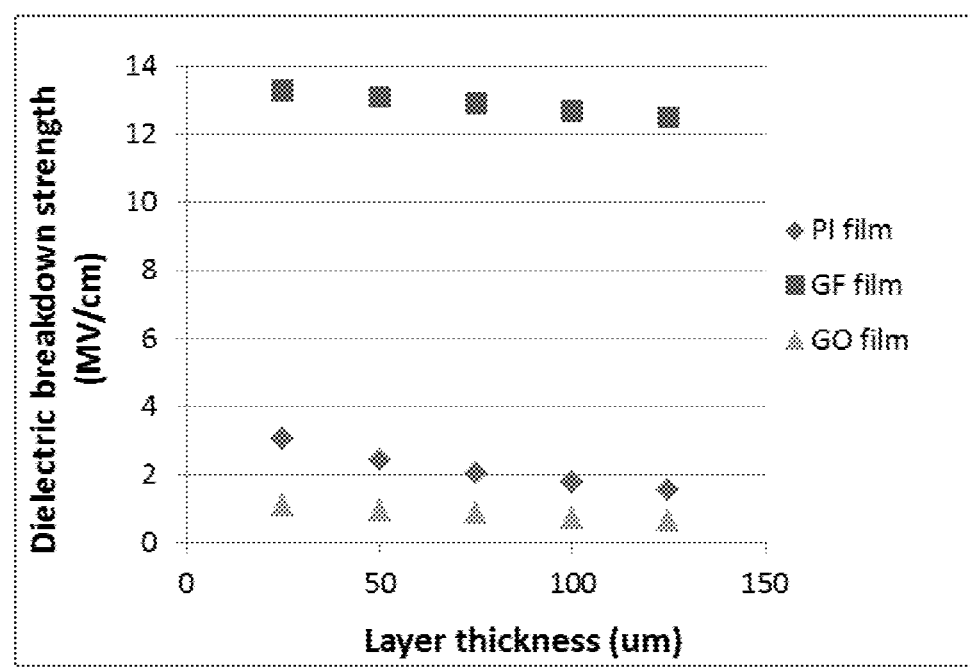
FIG. 8 Dielectric breakdown strength of GO film, GO-derived graphene fluoride film (made by the reverse roll transfer coating process), and polyimide film plotted as a function of the film thickness.

FIG. 8 shows the dielectric breakdown strength of GO film, presently invented GO-derived integrated graphene fluoride film (prepared by the reverse roll transfer coating process), and prior art polyimide film plotted as a function of the film thickness. These data indicate that the presently invented halogenated graphene films exhibit an exceptionally high dielectric breakdown strength (>12 MV/cm) even with a film thickness as high as 25-125 µm (unusual and un-expected). The dielectric breakdown strength values were found to be relatively independent of the film thickness. By contrast, for the same thickness range, the graphene oxide films endure a dielectric strength of 0.62-1.1 MV/cm, one order of magnitude lower. For comparison purposes, the commercially available polyimide films (du Pont Kapton films) have a dielectric strength of 1.54-3.03 MV/cm.

Figure 9:
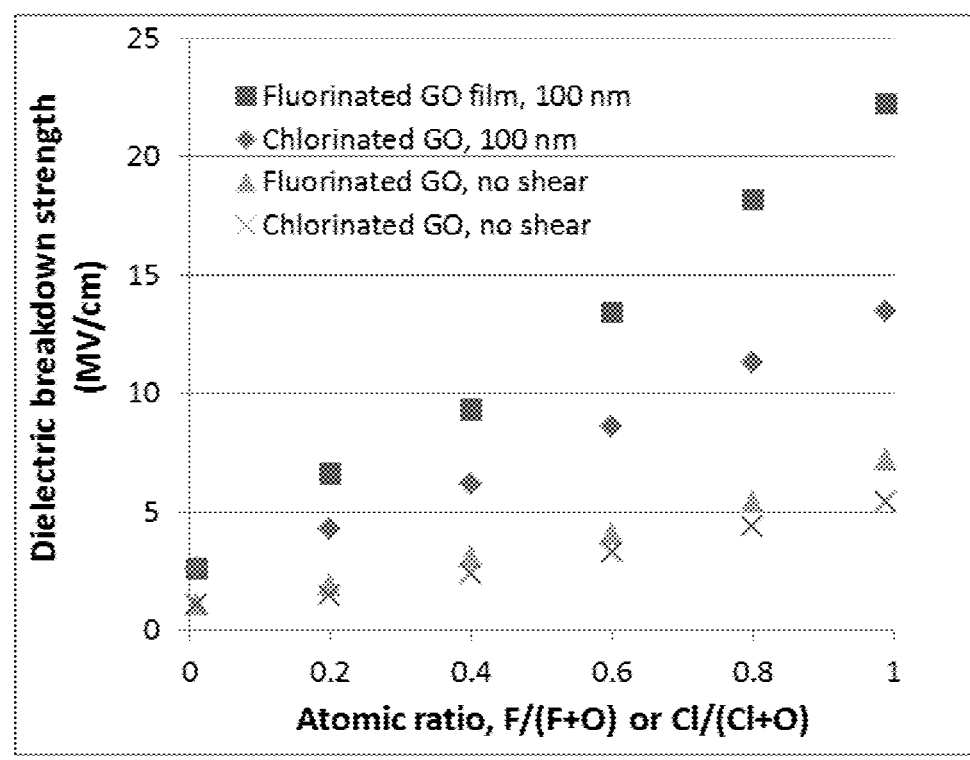
FIG. 9 Dielectric breakdown strength of GO-derived fluorinated graphene films and chlorinated graphene films (both prepared by a reverse roll transfer procedure and a casting procedure) plotted as a function of the degree of fluorination (atomic ratio, F/(F+O)) or the degree of chlorination (atomic ratio, Cl/(Cl+O)).

The dielectric breakdown strength of GO-derived fluorinated graphene films and chlorinated graphene films (both prepared by a reverse roll transfer procedure and, separately, by a casting procedure) are plotted as a function of the degree of fluorination (atomic ration, F/(F+O) or the degree of chlorination (atomic ratio, Cl/(Cl+O) in FIG. 9. The casting procedure did not involve any significant amount of shear stress, but the reverse-roll coating process includes high shear stresses in orienting GO and halogenated GO films. These data demonstrate that, given the same 100 nm thickness, the dielectric strength of the GO films were increased from 2.6 MV/cm for a pure GO film (no fluorination or zero degree of fluorination) to 22.2 MV/cm for a fully fluorinated film. This again asserts that fluorination can impart dramatically improved dielectric strength to the GO films. This is unexpected. Integrated films of chlorinated GO films follow the same trend.

Most significantly and also unexpectedly, the shear induced orientation of fluorinated or un-fluorinated GO sheets or molecules enables the integrated film to endure a significantly higher dielectric breakdown strength (2.6-22.2 MV/cm) than those (1.1-7.2 MV/cm) of the un-oriented or less oriented counterparts prepared by conventional casting. Similarly, integrated films of highly oriented chlorinated GO sheets or molecules also deliver much higher dielectric strength as compared to their cast counterparts wherein the sheets/molecules are not properly oriented. This is a highly significant discovery, which provides a versatile strategy for achieving exceptional dielectric strength of graphene materials.

Figure 10:
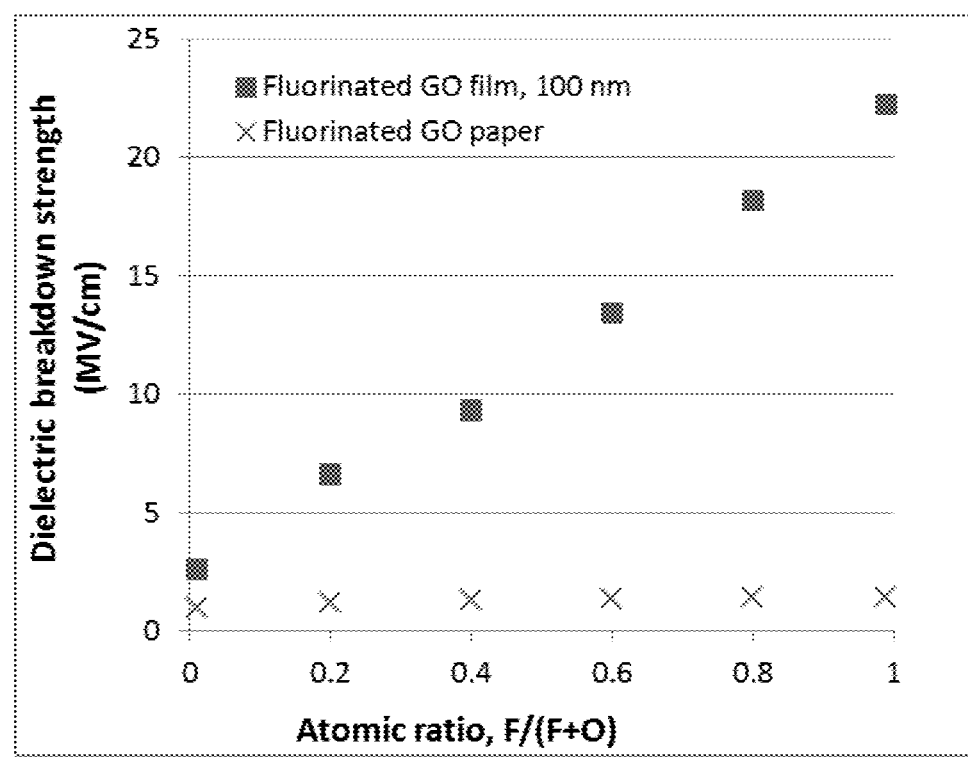
FIG. 10 Dielectric breakdown strength of GO-derived fluorinated graphene films (prepared by a reverse roll transfer procedure) and GO-derived fluorinated graphene paper prepared by the conventional paper-making procedure (vacuum-assisted filtration) plotted as a function of the degree of fluorination in terms of the atomic ratio, F/(F+O).

Summarized in FIG. 10 are dielectric breakdown strength of GO-derived fluorinated graphene films (prepared by a reverse roll transfer procedure) and GO-derived fluorinated graphene paper prepared by the conventional paper-making procedure (vacuum-assisted filtration) plotted as a function of the degree of fluorination in terms of the atomic ratio, F/(F+O). These data show that the dielectric strengths (1.1-1.45 MV/cm) of GO-based paper membranes prepared by the conventional method of vacuum-assisted filtration of multiple fluorinated GO sheets are relatively poor and are relatively independent of the degree of fluorination. Although some degree of orientation is achieved with this method, the dielectric strength remains very low. It seems that the defects, voids, kinks, and disruption of fluorinated GO sheets are local sites of concentrated electric fields that initiated the dielectric breakdown in these imperfections at a relatively low global (average) low voltage levels and then rapidly propagated across the entire sample. The presently invented process eliminates these imperfections.

Figure 11:
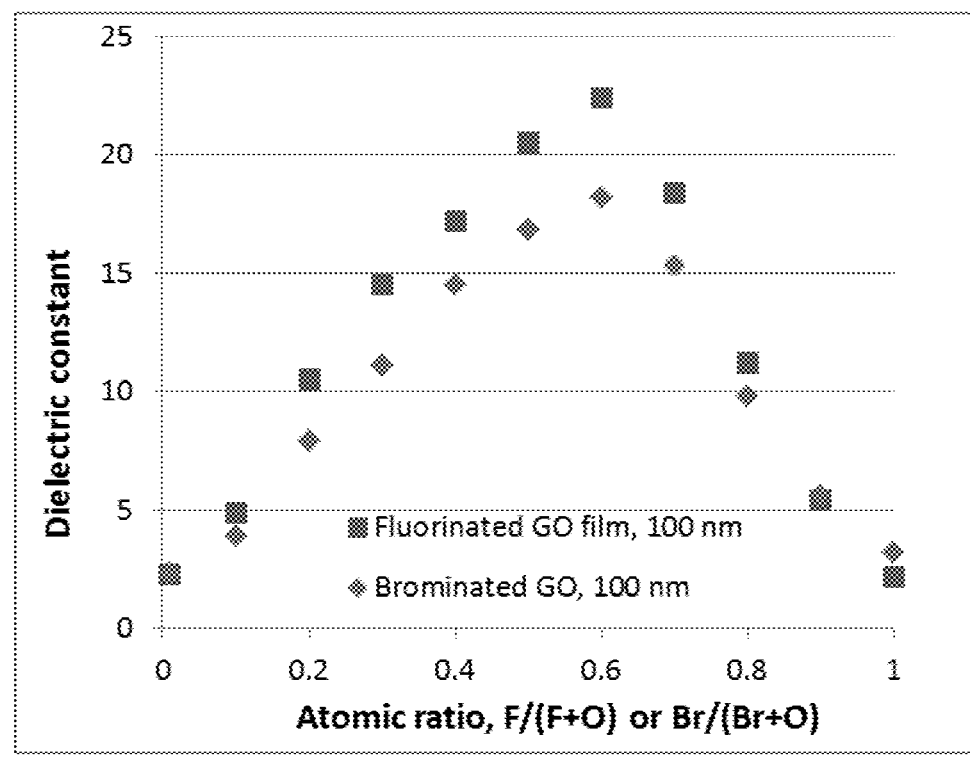
FIG. 11 Dielectric constants of GO-derived fluorinated graphene films and brominated graphene films plotted as a function of the degree of fluorination (atomic ratio, F/(F+O)) or the degree of bromination (atomic ratio, Br/(Br+O)).

Summarized in FIG. 11 are the dielectric constants of GO-derived fluorinated graphene films and brominated graphene films plotted as a function of the degree of fluorination (atomic ration, F/(F+O) or the degree of bromination (atomic ratio, Br/(Br+O). As the degree of fluorination or bromination increases, the dielectric constants of the integrated film of halogenated graphene increases, reaches a maximum, and then begins to decrease after the degree of fluorination or bromination exceeds 0.6. Most noteworthy is the observation that the partially halogenated GO films ($C_6Z_xO_y$, wherein Z is a halogen element selected from F, Cl, Br, I, x=0.01 to 6.0, y=0 to 5.0, and x+y≤6.0) can exhibit a dielectric constant from 3.9 to 22.2, in contrast to the dielectric constant value of 2.3 for integrated layer of GO (x=0; $C_6O_y$)

In summary, the integrated films of halogenated graphene (highly oriented GO-derived graphene halide films, GOGH) prepared from original graphene oxide suspension or GO gel using an orientation-controlling shear stress-based process have the following characteristics:

(1) The integrated halogenated graphene films (thin or thick) are an integrated halogenated graphene oxide or essentially oxygen-free graphene halide structure that is typically a poly-crystal having large grains. The film has wide or long chemically bonded graphene planes that are all essentially oriented parallel to one another. In other words, the crystallographic c-axis directions of all the constituent graphene planes in all grains are essentially pointing in the same direction.

(2) The reverse roll coating is very effective in achieving a high degree of graphene plane orientation and graphene halide crystal perfection.
(3) The co-existence of halogen and oxygen in the integrated halogenated GO layers leads to unexpected synergistic effect in producing films of high dielectric constants.
(4) The GOGH film is a fully integrated, essentially void-free, single graphene entity or monolith containing no discernable discrete flakes or platelets that were previously present in the original GO suspension. In contrast, the paper or membrane of graphene halide or GO platelets (each platelet <100 nm) are a simple, un-bonded aggregate/stack of multiple discrete platelets of GO or halogenated GO. The platelets in these paper/membranes are poorly oriented and have lots of kinks, bends, and wrinkles. Many voids or other defects are present in these paper/membrane structures, leading to poor dielectric breakdown strength.
(5) In prior art processes, discrete graphene or GO sheets (<<100 nm, typically <10 nm) that constitute the original structure of graphite particles could be obtained via expanding, exfoliating, and separating treatments. By simply mixing and re-compressing these discrete sheets/flakes into a bulk object, one could attempt to orient these sheets/flakes hopefully along one direction through compression. However, with these conventional processes, the constituent flakes or sheets of the resulting aggregate would remain as discrete flakes/sheets/platelets that can be easily discerned or clearly observed even with an un-assisted eye or under a low-magnification optical microscope (×100-×1000).

In contrast, the preparation of the presently invented integrated films of halogenated graphene involves heavily oxidizing the original graphite particles, to the extent that practically every one of the original graphene planes has been oxidized and isolated from one another to become individual graphene planes or molecules that possess highly reactive functional groups (e.g. —OH, >O, and —COOH) at the edge and on graphene plane surfaces. These individual hydrocarbon molecules (containing elements such as O and H, in addition to carbon atoms) are dispersed in a liquid medium (e.g. mixture of water and alcohol) to form a GO dispersion. This dispersion is then reverse roll-coated onto a smooth substrate surface, and the liquid components are then removed to form a dried GO layer. When slightly heated or aged, these highly reactive molecules react and chemically join with one another mostly in lateral directions along graphene planes (in an edge-to-edge manner to increase the length and width) and, in some cases, between graphene planes as well.

Figure 7D:
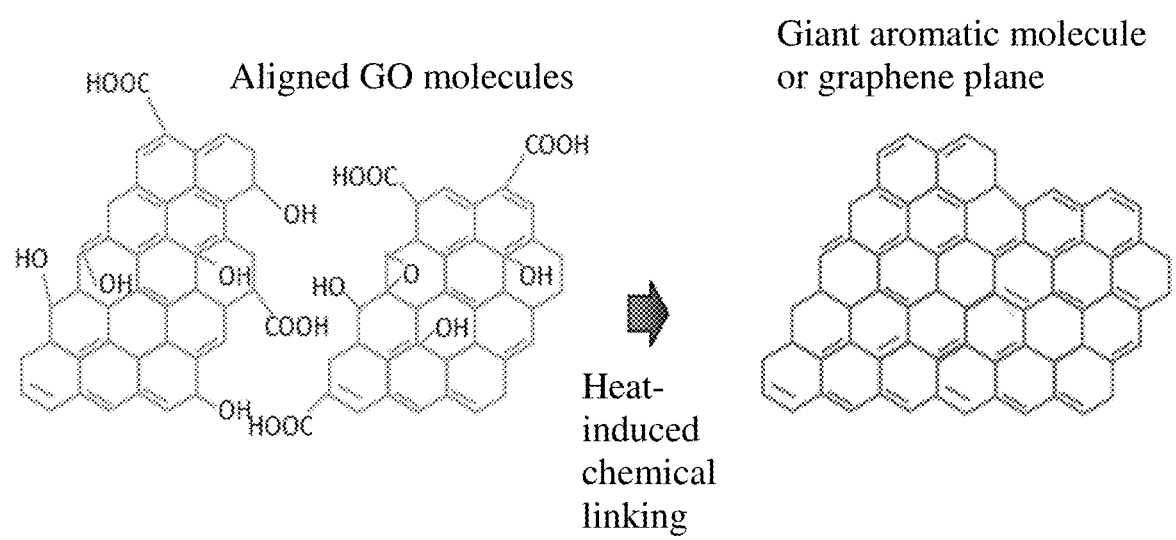
FIG. 7(D) One plausible chemical linking mechanism (only 2 GO molecules are shown as an example; a large number of GO molecules can be chemically linked together to form a graphene layer).

Illustrated in FIG. 7(D) is a plausible chemical linking mechanism where only 2 aligned GO molecules are shown as an example, although a large number of GO molecules can be chemically linked together to form a film. Further, chemical linking could also occur face-to-face, not just edge-to-edge. These linking and merging reactions proceed in such a manner that the molecules are chemically merged, linked, and integrated into one single entity. The molecules or "sheets" become dramatically longer and wider. The molecules (GO sheets) completely lose their own original identity and they no longer are discrete sheets/platelets. There is only one single layer-like structure that is essentially a network of interconnected giant molecules with an essentially infinite molecular weight. This may also be described as a graphene poly-crystal (with several grains, but typically no discernible, well-defined grain boundaries). All the constituent graphene planes are very large in lateral dimensions (length and width) and are aligned parallel to one another.

In-depth studies using a combination of SEM, TEM, selected area diffraction, X-ray diffraction, AFM, Raman spectroscopy, and FTIR indicate that the graphitic film is composed of several huge graphene planes (with length/width typically >>100 µm, more typically >>1 mm). These giant graphene planes are stacked and bonded along the thickness direction (crystallographic c-axis direction) often through not just the van der Waals forces (as in conventional graphite crystallites), but also covalent bonds. In these cases, wishing not to be limited by theory, but Raman and FTIR spectroscopy studies appear to indicate the co-existence of $sp^2$ (dominating) and $sp^3$ (weak but existing) electronic configurations, not just the conventional $sp^2$ in graphite.

(6) This integrated GOGH film is not made by gluing or bonding discrete flakes/platelets together with a resin binder, linker, or adhesive. Instead, GO or halogenated GO sheets (molecules) in the dispersion or gel are merged through joining or forming of covalent bonds with one another, into an integrated graphene entity, without using any externally added linker or binder molecules or polymers. These GO or halogenated GO molecules are "living" molecules capable of linking with one another in a way similar to living polymers chains undergoing "recombination" (e.g. a living chain of 1,000 monomer units and another living chain of 2,000 monomer units combine or join to become a polymer chain of 3,000 units). A 3,000-unit chain can combine with a 4,000-unit chain to become a giant chain of 7,000 units, and so on.

(7) This integrated film is typically a poly-crystal composed of large grains having incomplete grain boundaries, typically with the crystallographic c-axis in all grains being essentially parallel to each other. This entity is derived from a GO suspension or GO gel, which is in turn obtained from natural graphite or artificial graphite particles originally having multiple graphite crystallites. Prior to being chemically oxidized, these starting graphite crystallites have an initial length ($L_a$ in the crystallographic a-axis direction), initial width ($L_b$ in the b-axis direction), and thickness ($L_c$ in the c-axis direction). Upon heavy oxidation, these initially discrete graphite particles are chemically transformed into highly aromatic graphene oxide molecules having a significant concentration of edge- or surface-borne functional groups (e.g. —OH, —COOH, etc.). These aromatic, halogenated GO molecules in the GO suspension have lost their original identity of being part of a graphite particle or flake. Upon removal of the liquid component from the suspension and after thermal aging, the resulting GO molecules are chemically merged and linked into a unitary or monolithic graphene entity that is highly ordered.

The resulting unitary graphene entity typically has a length or width significantly greater than the $L_a$ and $L_b$ of the original crystallites. The length/width of this graphitic film is significantly greater than the $L_a$ and $L_b$ of the original crystallites. Even the individual grains in a poly-crystalline graphitic film have a length or width significantly greater than the $L_a$ and $L_b$ of the original crystallites.

(8) Due to these unique chemical compositions (including oxygen content), morphology, crystal structure (including inter-graphene spacing), and structural features (e.g. high degree of orientations, few defects, chemical bonding and no gap between graphene sheets, and no interruptions in graphene planes), the highly oriented graphene oxide-derived halogenated GO film has a unique combination of outstanding dielectric constants and dielectric breakdown strength.

In conclusion, we have successfully developed an absolutely new, novel, unexpected, and patently distinct class of dielectric materials: monolithic integrated films of highly oriented graphene halide. The chemical composition (oxygen and halogen contents), structure (crystal perfection, grain size, defect population, etc.), crystal orientation, achievable thickness with a high degree of orientation, morphology, process of production, and properties of this new class of materials are fundamentally different and patently distinct from any known graphene materials. These halogenated graphene films can be used as a dielectric material component in a wide variety of microelectronic devices.

We claim:

1. A process for producing an integrated layer of highly oriented halogenated graphene sheets or molecules, said process comprising:
   (a) preparing either a graphene oxide dispersion having graphene oxide sheets dispersed in a fluid medium or a graphene oxide gel having graphene oxide molecules dissolved in a fluid medium, wherein said graphene oxide sheets or graphene oxide molecules contain an oxygen amount greater than 5% by weight;
   (b) introducing a halogenating agent into said graphene oxide dispersion or gel and effecting a chemical reaction between said halogenating agent and said graphene oxide sheets or molecules to form a dispersion of halogenated graphene sheets or a gel of halogenated graphene molecules, wherein said halogenated graphene sheets or molecules have a chemical formula of $C_6Z_xO_y$, wherein Z is a halogen element selected from F, Cl, Br, I, or a combination thereof, x=0.01 to 6.0, y=0 to 5.0, and x+y≤6.0;
   (c) dispensing and depositing a layer of said halogenated graphene dispersion or gel onto a surface of a supporting substrate under a shear stress condition, wherein said dispensing and depositing procedure includes shear-induced thinning of said halogenated graphene dispersion or gel and shear-induced orientation of halogenated graphene sheets or molecules, to form a wet layer of halogenated graphene on said supporting substrate; and
   (d) removing said fluid medium from the wet layer of halogenated graphene to form said integrated layer of halogenated graphene having an inter-planar spacing $d_{002}$ of 0.35 nm to 1.2 nm as determined by X-ray diffraction.

2. The process of claim 1, wherein the halogenating agent is selected from hydrofluoric acid, hexafluorophosphoric acid or $HPF_6$, $XeF_2$, —HCl, $HPCl_6$, $XeCl_2$, HBr, $XeBr_2$, HI, $XeI_2$, $I_2$, or a combination thereof.

3. The process of claim 1, wherein the step of dispensing and depositing includes a printing, spraying and/or casting procedure, which is in combination with a shear stress procedure.

4. The process of claim 1, further comprising a step of aging said dispersion or gel of halogenated graphene after step (c), or aging said integrated layer of halogenated graphene after step (d), in an aging room at an aging temperature from 25° C. to 100° C. and humidity level from 20% to 99% for an aging time of 1 hour to 7 days.

5. The process of claim 1, further comprising a compression step, during or after a heat treatment step, to reduce a thickness of said graphitic film.

6. The process of claim 1, wherein the integrated layer of halogenated graphene is a poly-crystal graphene structure having a crystalline orientation as determined by X-ray diffraction or electron diffraction methods.

* * * * *